(12) United States Patent
Higuchi

(10) Patent No.: US 7,615,781 B2
(45) Date of Patent: Nov. 10, 2009

(54) SEMICONDUCTOR WAFER AND SEMICONDUCTOR DEVICE, AND METHOD FOR MANUFACTURING SAME

(75) Inventor: Minoru Higuchi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 182 days.

(21) Appl. No.: 11/633,502

(22) Filed: Dec. 5, 2006

(65) Prior Publication Data

US 2007/0131931 A1 Jun. 14, 2007

(30) Foreign Application Priority Data

Dec. 14, 2005 (JP) .............................. 2005-359895

(51) Int. Cl.
*H01L 23/58* (2006.01)
(52) U.S. Cl. .............................. 257/48; 257/57; 257/60; 438/17; 438/18; 324/765
(58) Field of Classification Search .................. 257/48, 257/57, 60; 438/17, 18; 324/765
See application file for complete search history.

(56) References Cited

U.S. PATENT DOCUMENTS

| 6,747,471 | B1 * | 6/2004 | Chen et al. | 324/765 |
| 6,950,356 | B2 * | 9/2005 | Tao | 365/201 |
| 2006/0138614 | A1 * | 6/2006 | Kimura | 257/666 |
| 2007/0109003 | A1 * | 5/2007 | Shi et al. | 324/755 |

FOREIGN PATENT DOCUMENTS

| JP | 2000-214228 | 8/2000 |
| JP | 2000-260823 | 9/2000 |

* cited by examiner

*Primary Examiner*—Phuc T Dang
(74) *Attorney, Agent, or Firm*—McGinn IP Law Group, PLLC

(57) ABSTRACT

There is a room for improvement in conventional semiconductor devices in terms of reducing the chip area. A semiconductor device 1 comprises an evaluation transistor 10 (first characteristic evaluation device), an evaluation transistor (second characteristic evaluation device), measurement pads 30 (first measurement pads) and measurement pads 40 (second measurement pads). The measurement pad 30 and the measurement pad 40 are provided in different layers in the interconnect layer.

20 Claims, 25 Drawing Sheets

SEMICONDUCTOR WAFER AND SEMICONDUCTOR DEVICE, AND METHOD FOR MANUFACTURING SAME

This application is based on Japanese patent application No. 2005-359,895, the content of which is incorporated hereinto by reference.

BACKGROUND

1. TECHNICAL FIELD

The present invention relates to a semiconductor wafer and a semiconductor device, and a method for manufacturing thereof.

2. RELATED ART

Typical conventional semiconductor devices include, for example, a semiconductor device described in Japanese Patent Laid-Open No. 2000-214,228. A semiconductor device described in Japanese Patent Laid-Open No. 2000-214,228 is provided with an evaluation transistor, which is an object for an evaluation in electrical characteristics. Evaluation pads are coupled to a source terminal, a drain terminal and a gate terminal of evaluation transistor, respectively. These evaluation pads are formed on a surface of an interlayer insulating film, or in other words, formed on a top layer of the interconnect layer. In addition to above, prior art related to the present invention also includes a semiconductor device described in Japanese Patent Laid-Open No. 2000-260,833, in addition to a semiconductor device described in Japanese Patent Laid-Open No. 2000-214,228.

Meanwhile, concerning the characteristic evaluation device such as the above-described evaluation transistor, a plurality of characteristic evaluation devices are provided in one semiconductor device. Accordingly, a plurality of evaluation pads are also provided. However, such evaluation pad requires relatively larger area. Therefore, an increase of number of the evaluation pads leads to an increase of the chip area. Therefore, there is a room for improvement in the semiconductor device described in Japanese Patent Laid-Open No. 2000-214,228 in terms of reducing the chip area.

SUMMARY OF THE INVENTION

According to one aspect of the present invention, there is provided a semiconductor device, comprising: a first characteristic evaluation device; a second characteristic evaluation device, which is not the same as the first characteristic evaluation device; a first measurement pad coupled to the first characteristic evaluation device, the first measurement pad being employed for measuring electrical characteristics of the first characteristic evaluation device; and a second measurement pad coupled to the second characteristic evaluation device, the second measurement pad being employed for measuring electrical characteristics of the second characteristic evaluation device, wherein the first measurement pad and the second measurement pad are provided in different layers.

In such semiconductor device, the first and the second measurement pads are coupled to the first and the second characteristic evaluation devices, respectively. Here, the first measurement pad is provided in a layer, which is different from a layer provided with the second measurement pad. This configuration can provides a reduced chip area, as compared with the case where these measurement pads are provided in the same layer.

According to another aspect of the present invention, there is provided a semiconductor wafer, comprising: a first characteristic evaluation device; a second characteristic evaluation device, which is not the same as the first characteristic evaluation device; a first measurement pad coupled to the first characteristic evaluation device, the first measurement pad being employed for measuring electrical characteristics of the first characteristic evaluation device; and a second measurement pad coupled to the second characteristic evaluation device, the second measurement pad being employed for measuring electrical characteristics of the second characteristic evaluation device, wherein the first measurement pad and the second measurement pad are provided in different layers.

In this semiconductor wafer, the first and the second measurement pads are coupled to the first and the second characteristic evaluation devices, respectively.

Here, the first measurement pad is provided in a layer, which is different from a layer provided with the second measurement pad. This configuration can provides a reduced chip area, as compared with the case where these measurement pads are provided in the same layer.

According to further aspect of the present invention, there is provided a method for manufacturing a semiconductor device, including: forming a first characteristic evaluation device; forming a second characteristic evaluation device, which is not the same as the first characteristic evaluation device; forming a first measurement pad so as to be coupled to the first characteristic evaluation device; measuring an electrical characteristic of the first characteristic evaluation device by applying a predetermined potential to the first measurement pad; forming a second measurement pad so as to be coupled to the second characteristic evaluation device; and measuring an electrical characteristic of the second characteristic evaluation device by applying a predetermined potential to the second measurement pad, wherein the first measurement pad and the second measurement pad are provided in different layers.

In this method for manufacturing the semiconductor device, the first and the second measurement pads are formed to be coupled to the first and the second characteristic evaluation devices, respectively. Here, the first measurement pad is provided in a layer, which is different from a layer provided with the second measurement pad. This configuration can provides a reduced chip area, as compared with the case where these measurement pads are provided in the same layer.

According to the present invention, a semiconductor wafer and a semiconductor device, which are configured to be suitable for achieving a miniaturization of a chip, and a method for manufacturing thereof are achieved.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments of semiconductor wafers and semiconductor devices, and methods for manufacturing thereof according to the present invention will be described as follows in further detail, in reference to the annexed figures. In all figures, an identical numeral is assigned to an element commonly appeared in the figures, and redundant descriptions thereof will not be repeated.

First Embodiment

Figure 1:
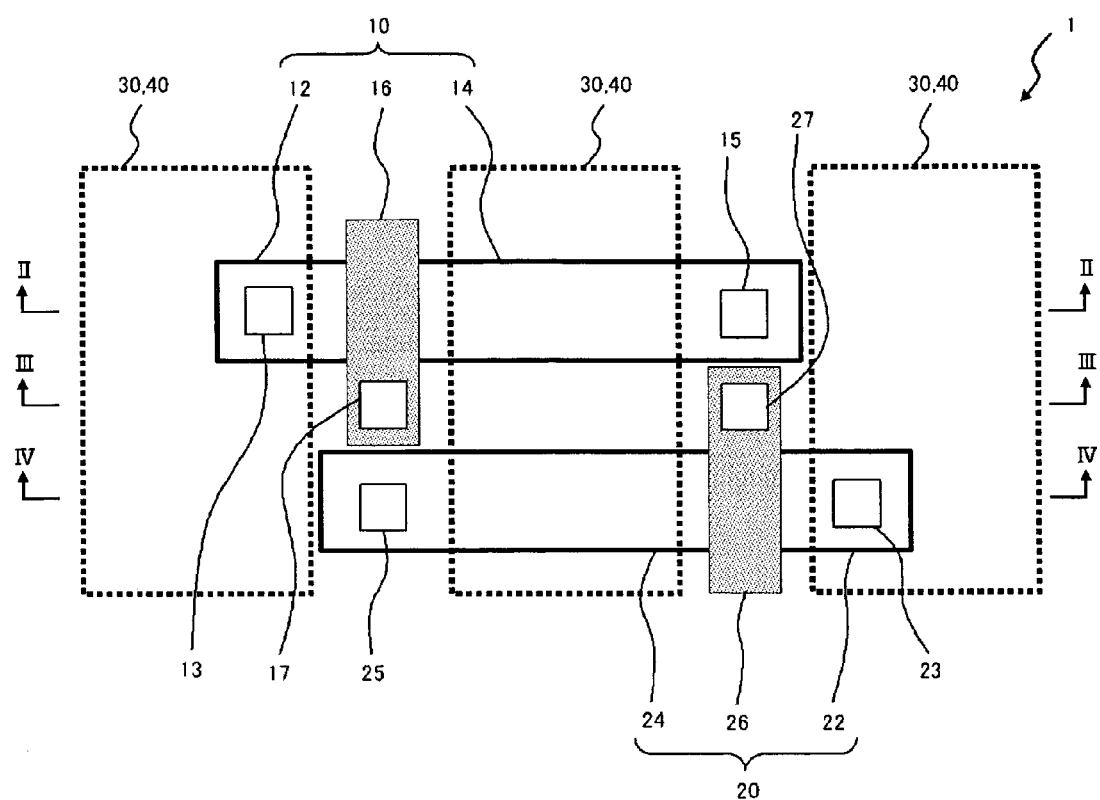
FIG. 1 is a plan view, illustrating first embodiment of a semiconductor device according to the present invention.
Figure 2:
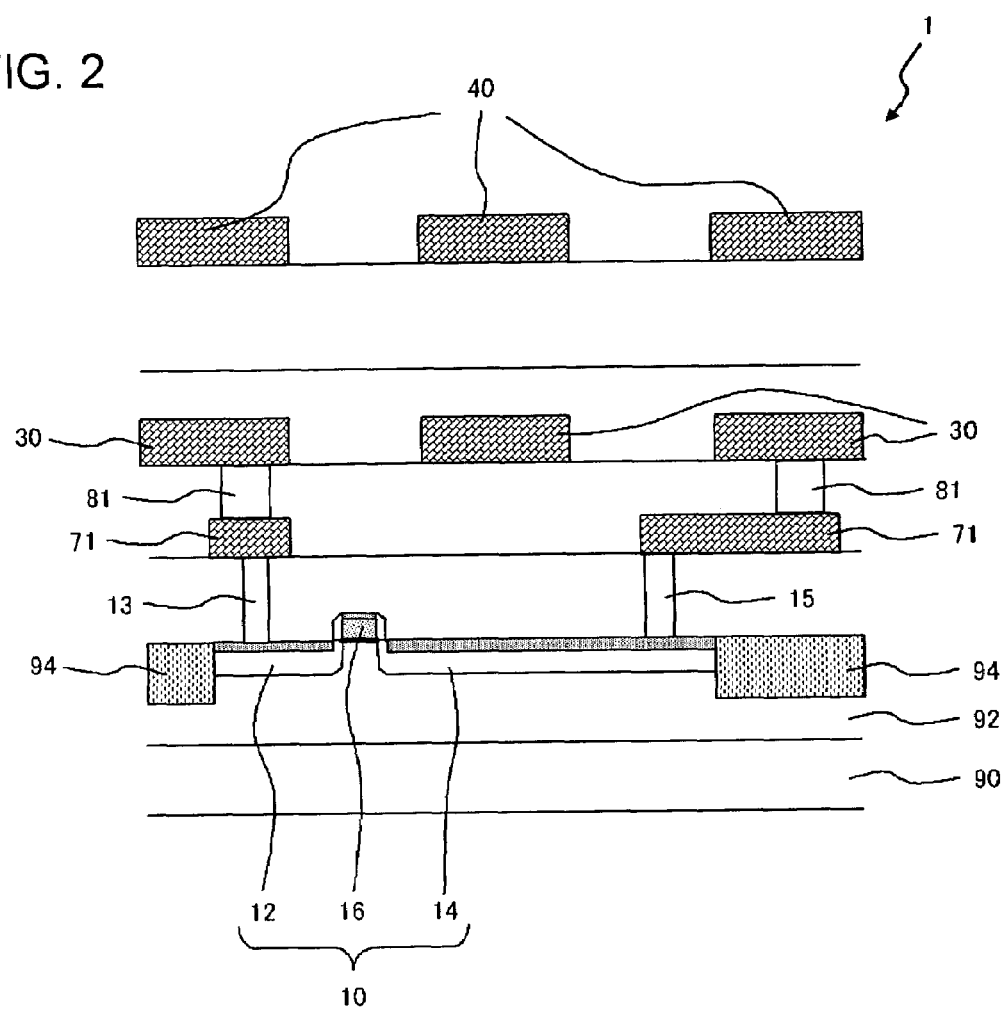
FIG. 2 is a cross-sectional view, showing a cross section of the semiconductor device of FIG. 1 along line II-II.
Figure 3:
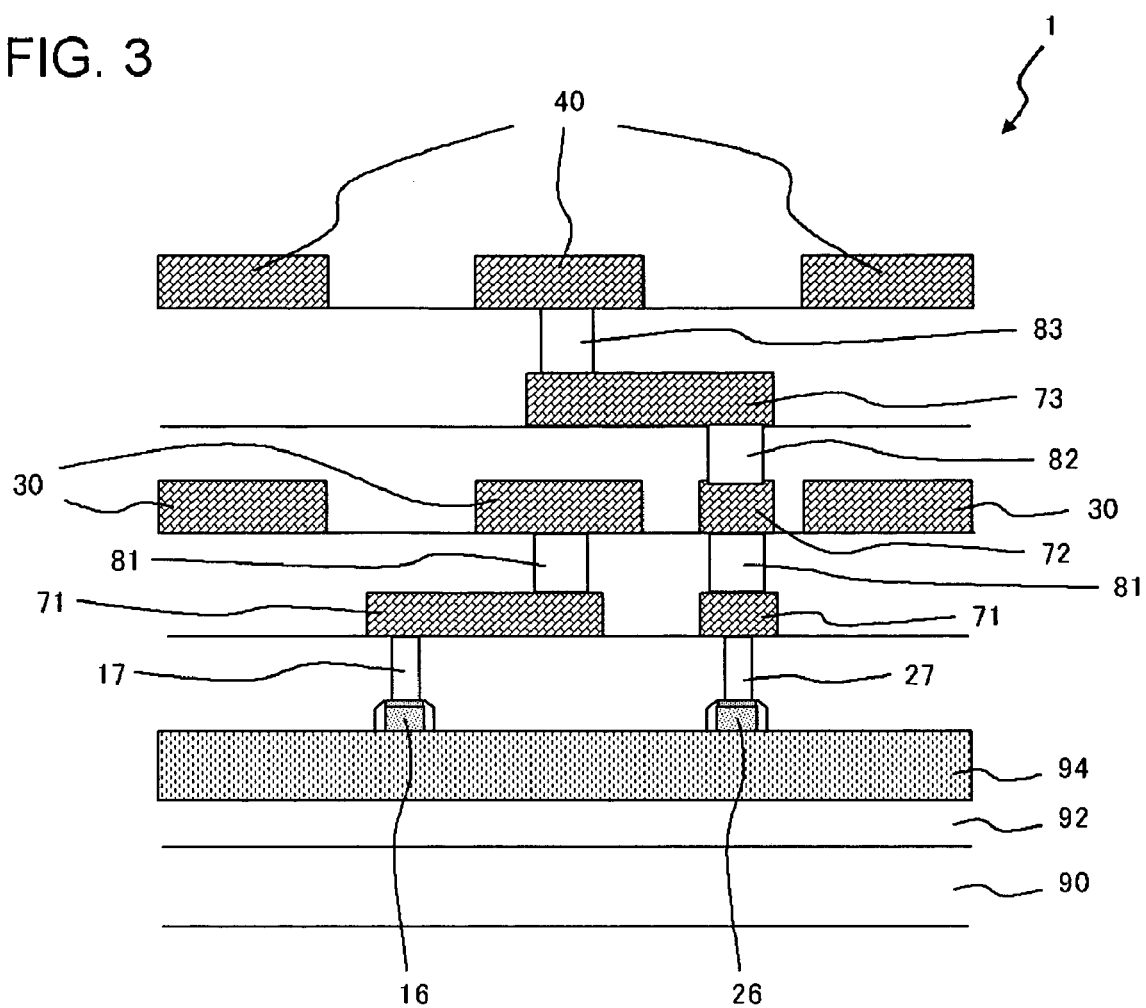
FIG. 3 is a cross-sectional view, showing a cross section of the semiconductor device of FIG. 1 along line III-III.
Figure 4:
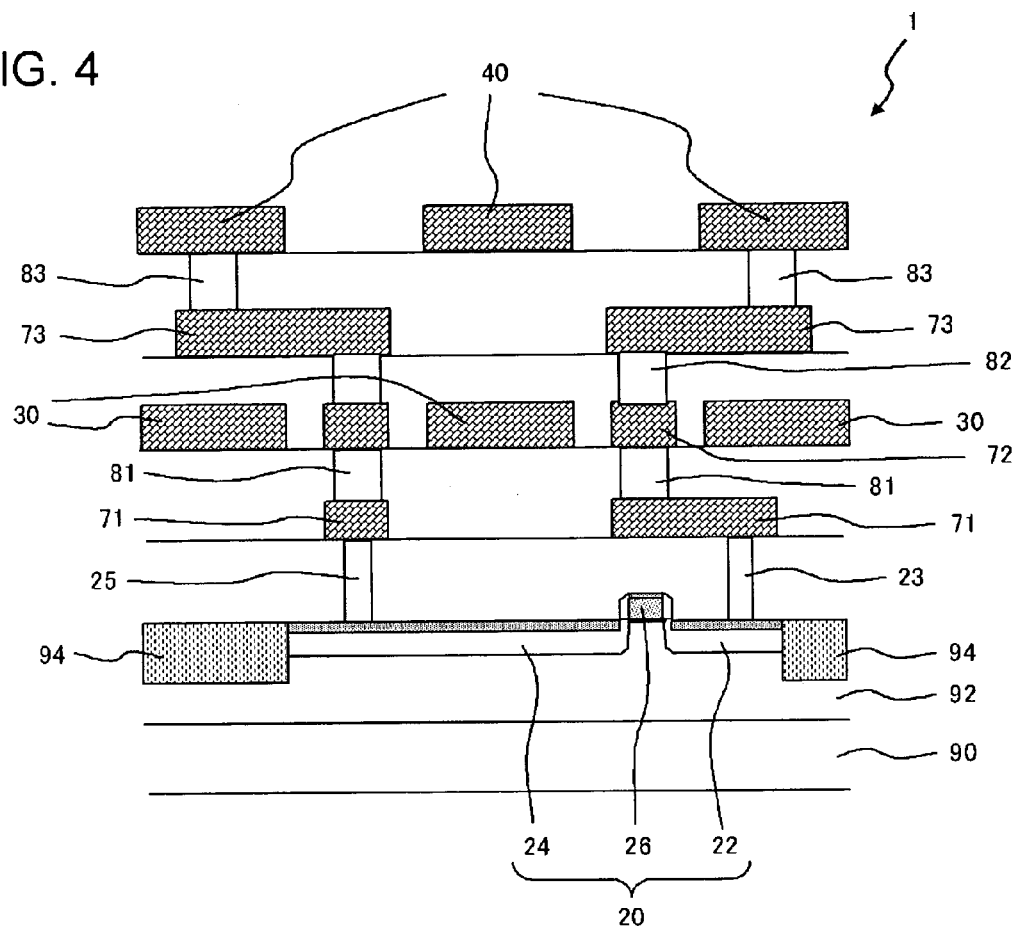
FIG. 4 is a cross-sectional view, showing a cross section of the semiconductor device of FIG. 1 along line IV-IV.

FIG. 1 is a plan view, illustrating first embodiment of a semiconductor device according to the present invention. FIG. 2, FIG. 3 and FIG. 4 are cross-sectional views, showing cross sections along line II-II, line III-III and line IV-IV in FIG. 1, respectively. A semiconductor device 1 comprises an evaluation transistor 10 (first characteristic evaluation device), an evaluation transistor 20 (second characteristic evaluation device), measurement pads 30 (first measurement pads) and measurement pads 40 (second measurement pads).

The evaluation transistor 10 includes a source region 12, a drain region 14 and a gate electrode 16. Similarly, the evaluation transistor 20 includes a source region 22, a drain region 24 and a gate electrode 26. The source regions 12 and 22 and the drain regions 14 and 24 are formed in a well region 92 in the semiconductor substrate 90. Typical semiconductor substrate 90 is, for example, p-type silicon substrate. In addition, the gate electrodes 16 and 26 are formed on the well region 92 via the gate insulating film, which is not shown.

The evaluation transistor 10 and the evaluation transistor 20 are, as can be seen from the diagram, different devices, or in other words, discrete devices that are separately provided. These devices are mutually isolated by a device isolation region 94. The device isolation region 94 is, for example, a shallow trench isolation (STI) region. Particularly in the present embodiment, the evaluation transistor 10 and the evaluation transistor 20 are formed under different values of the design parameters. Typical design parameters includes, for example, a gate length, a gate width, a gate film thickness, an impurity concentration, or the like. It would be sufficient to conclude that the evaluation transistor 10 involves different value of a design parameter from the evaluation transistor 20, if a value of at least one of the design parameters for the evaluation transistor 10 is different from a value of such design parameter for the evaluation transistor 20.

The measurement pads 30 are coupled to the evaluation transistor 10. More specifically, the measurement pads 30 are coupled to the source region 12, the drain region 14 and the gate electrode 16, respectively. That is, a single measurement pad 30 is provided to each of the source terminal, the drain terminal and the gate terminal of the evaluation transistor 10. The measurement pad 30 is employed for measuring electrical characteristics of the evaluation transistor 10. More specifically, a predetermined potential is applied to the measurement pad 30, so that electrical characteristics of the evaluation transistor 10 are measured. These measurement pads 30 are provided in second layer of the interconnect layer.

As shown in FIG. 2, the source region 12 is coupled to the measurement pad 30 via a contact plug 13, an interconnect 71 and a via plug 81. Similarly, the drain region 14 is coupled to the measurement pad 30 via a contact plug 15, the interconnect 71 and the via plug 81. In addition, as shown in FIG. 3, the gate electrode 16 is coupled to the measurement pad 30 via a contact plug 17, the interconnect 71 and the via plug 81. Here, the interconnect 71 and the via plug 81 are an interconnect and a via plug, which are provided in first layer (lowermost layer) in the interconnect layer, respectively. In addition to above, the interconnect layer does not contain a layer, which is provided with a contact plug.

The measurement pads 40 are coupled to the evaluation transistor 20. More specifically, the measurement pads 40 are coupled to the source region 22, the drain region 24 and the gate electrode 26, respectively. That is, a single measurement pad 40 is provided to each of the source terminal, the drain terminal and the gate terminal of the evaluation transistor 20. The measurement pad 40 is employed for measuring electrical characteristics of the evaluation transistor 20. More specifically, a predetermined potential is applied to the measurement pad 40, so that electrical characteristics of the evaluation transistor 20 are measured. This measurement pad 40 is provided in fourth layer of the interconnect layer.

As shown in FIG. 4, the source region 22 is coupled to the measurement pad 40 via a contact plug 23, the interconnects 71, 72 and 73 and the via plugs 81, 82 and 83. Similarly, the drain region 24 is coupled to the measurement pad 40 via a contact plug 25, the interconnects 71, 72 and 73 and the via plugs 81, 82 and 83. In addition, as shown in FIG. 3, the gate electrode 26 is coupled to the measurement pad 40 via a contact plug 27, the interconnects 71, 72 and 73 and the via plugs 81, 82 and 83. Here, the interconnect 72 and the via plug 82 are an interconnect and a via plug, which are provided in second layer in the interconnect layer, respectively. Further, the interconnect 73 and the via plug 83 are an interconnect and a via plug, which are provided in third layer in the interconnect layer, respectively.

As described above, the measurement pad 30 and the measurement pad 40 are provided in different layers in the interconnect layer. In the present embodiment, the measurement pad 40 is provided to be disposed in fourth layer, which is upper than second layer that is provided with the measurement pad 30, as described above. In the semiconductor device 1, such fourth layer corresponds to an uppermost layer in the interconnect layer.

Further, as shown in FIG. 1, the measurement pad 30 substantially perfectly overlaps with the measurement pad 40 in plan view. Here, the situation of "the measurement pad 30 overlapping with the measurement pad 40 in plan view" is that, when images of these measurement pads are orthogonally projected onto a plane that is parallel to the principal surface of the semiconductor substrate 90, a region where those images partially overlap is formed. A case where the images of these measurement pads are substantially identical is referred to as, in particular, the situation of "the measurement pad 30 substantially perfectly overlapping with the measurement pad 40 in plan view". Therefore, one of necessary conditions for achieving the situation where the measurement pad 30 substantially perfectly overlaps with the measurement pad 40 in plan view may be that these measurement pads have the same area. In reality, the configuration according to the present embodiment satisfies such necessary condition.

An exemplary implementation of a process for manufacturing the semiconductor device 1 will described in reference to FIGS. 5A to 5C and FIGS. 6A to 6C, as an embodiment of a process for manufacturing the semiconductor device according to the present invention. By summarizing, such manufacturing process includes the following operations (a) to (f):

(a) an operation for forming an evaluation transistor 10;
(b) an operation for forming an evaluation transistor 20;
(c) an operation for forming a measurement pad 30 so as to be coupled to the evaluation transistor 10;
(d) an operation for measuring electrical characteristics of the evaluation transistor 10 by applying a predetermined potential to the measurement pad 30;
(e) an operation for forming a measurement pad 40 so as to be coupled to the evaluation transistor 20; and
(f) an operation for measuring electrical characteristics of the evaluation transistor 20 by providing a predetermined potential to the measurement pad 40.

Figure 5A:
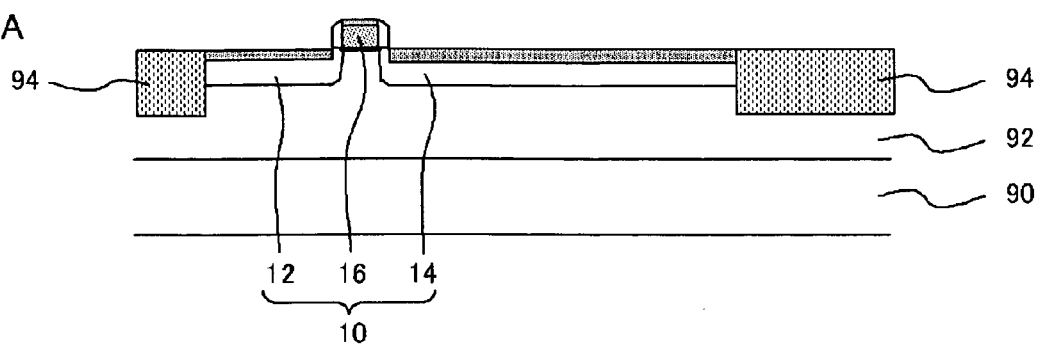
FIGS. 5A to 5C are cross-sectional views of the 5 semiconductor device, illustrating a process for manufacturing the semiconductor device of FIG. 1.
Figure 5B:
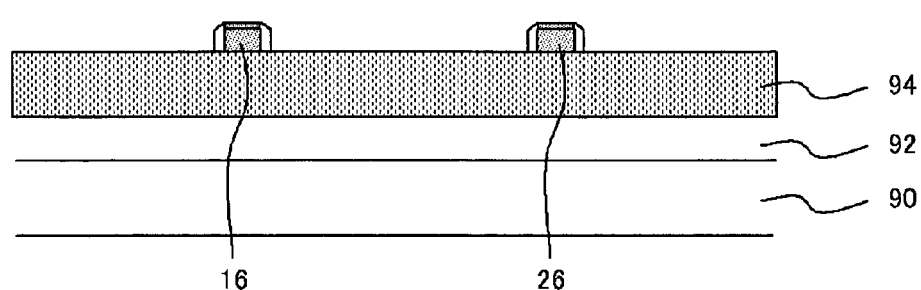
Figure 5C:
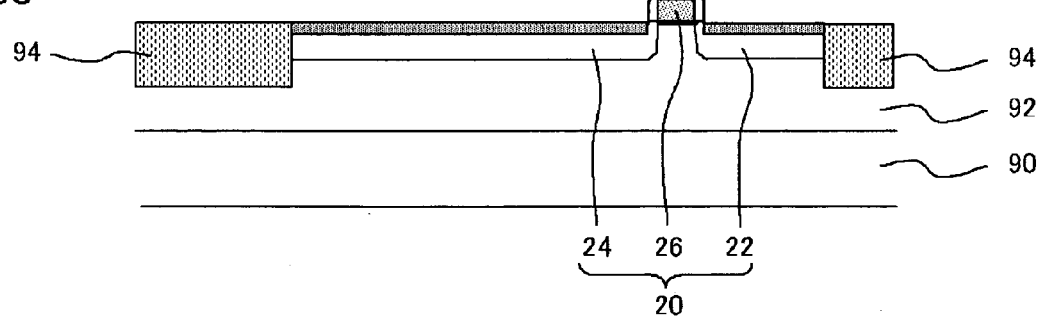

As will describe in more detail, first of all, the evaluation transistor 10 and the evaluation transistor 20 are formed on the semiconductor substrate 90, which includes a well region 92 and a device isolation region 94 formed thereon (FIG. 5A to FIG. 5C). FIG. 5A, FIG. 5B and FIG. 5C show cross sections similarly as in FIG. 2, FIG. 3 and FIG. 4, respectively. In addition to above, either one of the evaluation transistor 10 and the evaluation transistor 20 may be formed first, or both may be simultaneously formed.

Figure 6A:
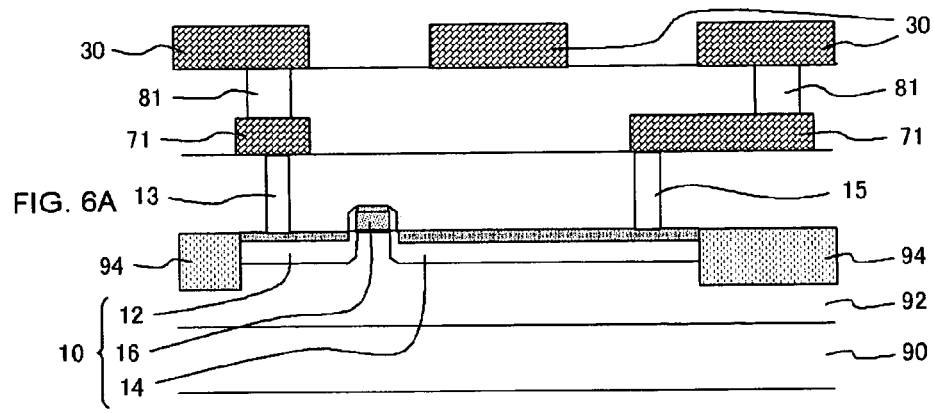
FIGS. 6A to 6C are cross-sectional views of the semiconductor device, illustrating a process for manufacturing the semiconductor device of FIG. 1.
Figure 6B:
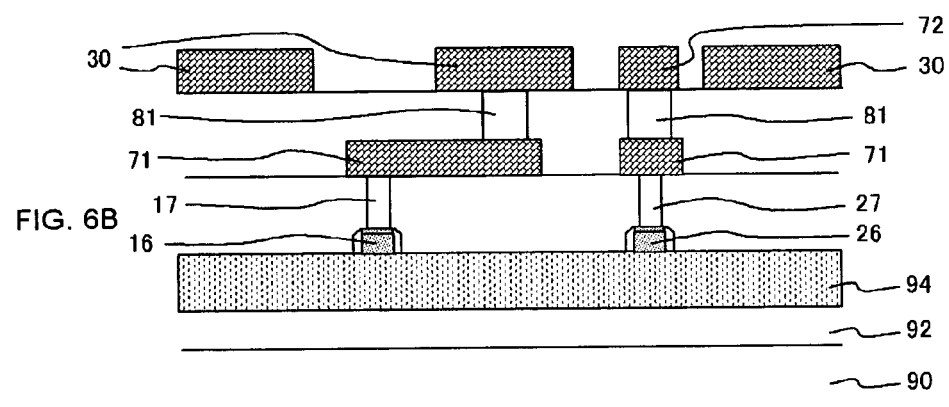
Figure 6C:
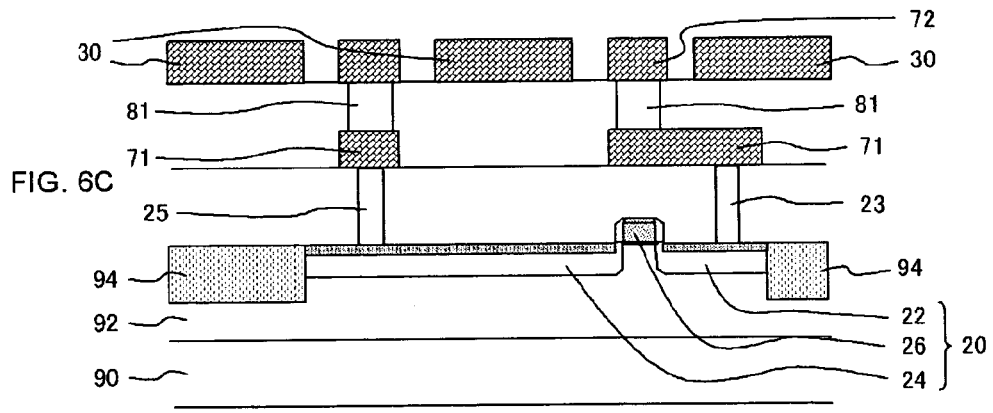

Next, contact plugs 13, 15, 17, 23, 25 and 27 are formed, and then, interconnects 71 and via plugs 81 are sequentially formed. Subsequently, the measurement pads 30 are formed. On such occasion, interconnects 72 are also formed in addition to the measurement pads 30 (FIG. 6A to FIG. 6C). FIG. 6A, FIG. 6B and FIG. 6C show cross sections similarly as in FIG. 2, FIG. 3 and FIG. 4, respectively. Then, a predetermined potential is provided to the measurement pad 30 to measure electrical characteristics of the evaluation transistor 10.

Next, the via plugs 82, the interconnects 73 and the via plugs 83 are sequentially formed. Subsequently, the measurement pads 40 are formed. This leads to obtain the semiconductor device 1 shown in FIG. 1 to FIG. 4. Then, a predetermined potential is provided to the measurement pad 40 to measure electrical characteristics of the evaluation transistor 20.

In addition to above, an operation for dicing a wafer having the evaluation transistor 10 and the evaluation transistor 20 formed therein may be carried out after the operation for forming the measurement pad 30 and the operation for forming the measurement pad 40. In such case, a semiconductor device 1 in a condition of comprising divided chips is obtained.

Advantageous effects obtainable by the configuration according to the present embodiment will be described. In the present embodiment, the measurement pads 30 and the measurement pads 40 are coupled to the evaluation transistor 10 and the evaluation transistor 20, respectively. Here, the measurement pads 30 are provided in a layer, which is different from a layer provided with the measurement pads 40. This configuration can provides a reduced chip area, as compared with the case where these measurement pads are provided in the same layer. Thus, the semiconductor device 1, which is configured to be suitable for achieving a miniaturization of chips, and the method for manufacturing thereof, are achieved.

The measurement pad 30 overlaps with the measurement pad 40 in plan view. This reduces area required for mounting the measurement pads, as compared with a configuration that the measurement pad 30 does not overlap with the measurement pad 40. More specifically, area required for mounting the measurement pads can be reduced by at least area of the portion that both pads overlap. Particularly in the present embodiment, the measurement pad 30 substantially perfectly overlaps with the measurement pad 40 in plan view. This further reduces area required for mounting the measurement pads.

Area of the measurement pads 30 is substantially equivalent to area of the measurement pads 40. Such configuration is suitable for conducting characteristic evaluations for the evaluation transistor 10 and the evaluation transistor 20 employing one probe card.

The evaluation transistor 10 involves different value of a design parameter from a value of the design parameter of the evaluation transistor 20. Consequently, characteristic evaluations for respective characteristic evaluation devices having different values of a design parameter can be conducted. This achieves conducting further effective characteristic evaluations. This, in turn, contributes to provide an improved production yield and an improved reliability of the semiconductor devices.

The measurement pads 40 are provided to be the uppermost layer in the interconnect layer. This configuration achieves conducting the characteristic evaluations for the evaluation transistor 20, even if the evaluations is to be conducted after forming the interconnect layer.

A single measurement pad 30 is provided to each of the terminals of the evaluation transistor 10, and a single measurement pad 40 is provided to each of the terminals of the evaluation transistor 20. Thus, the configuration of sharing no measurement pad between the evaluation transistor 10 and the evaluation transistor 20 is employed as described above, such that the characteristic evaluations for the evaluation transistor 10 and the evaluation transistor 20 can be successfully conducted.

Figure 24:
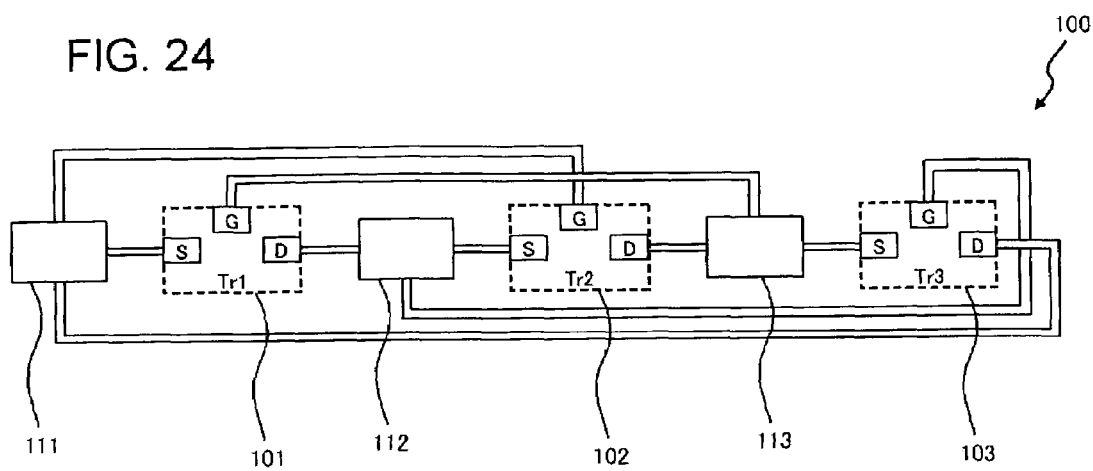
FIG. 24 is a plan view of a semiconductor device described in a related prior art (Japanese Patent Laid-Open No. 2000-260,833)

On the contrary, in the semiconductor device described in Japanese Patent Laid-Open No. 2000-260,833, a measurement pad is shared between a plurality of evaluation transistors. FIG. 24 is a plan view, illustrating a semiconductor device described in Japanese Patent Laid-Open No. 2000-260,833. A semiconductor device 100 is provided with evaluation transistors 101, 102 and 103 and measurement pads 111, 112 and 113.

Here, the measurement pad 111 is coupled to a source terminal of the evaluation transistor 101, a gate terminal of the evaluation transistor 102 and a drain terminal of the evaluation transistor 103. The measurement pad 112 is coupled to a drain terminal of the evaluation transistor 101, a source terminal of the evaluation transistor 102 and a gate terminal of the evaluation transistor 103. Further, the measurement pad 113 is coupled to a gate terminal of the evaluation transistor 101, a drain terminal of the evaluation transistor 102 and a source terminal of evaluation transistor 103.

However, when a measurement pad is shared between a plurality of evaluation transistors as described above, a problem of limited maximum level of the electrical voltage that is capable of being applied to the measurement pad (issue of insufficient breakdown voltage) may be caused. More specifically, when breakdown voltages for a plurality of evaluation transistors that share a measurement pad are different, a level of the electrical voltage that can be applied to the measurement pad is limited by a minimum voltage among these breakdown voltages. This means that characteristic evaluations cannot be conducted for any evaluation transistors except the evaluation transistor having a minimum breakdown voltage. Therefore, satisfactory characteristic evaluation is disturbed. In recent years, such problem manifests, as a technical trend of achieving a decreased thickness of the gate insulating film leads to a reduced breakdown voltage of the transistor.

Moreover, when a leakage current measurement is conducted as a part of the characteristic evaluations, a plurality of leakage paths exists for a measurement pad, such that a problem of being unable to identify a leakage path (issue of unidentified leakage path) may also be caused. This may be also an obstruction to the characteristic evaluations.

On the other hand, since no measurement pad is shared between the evaluation transistor 10 and the evaluation transistor 20 according to the present embodiment, both of the issue of insufficient breakdown voltage and the issue of unidentified leakage path can be avoided.

Second Embodiments

Figure 7:
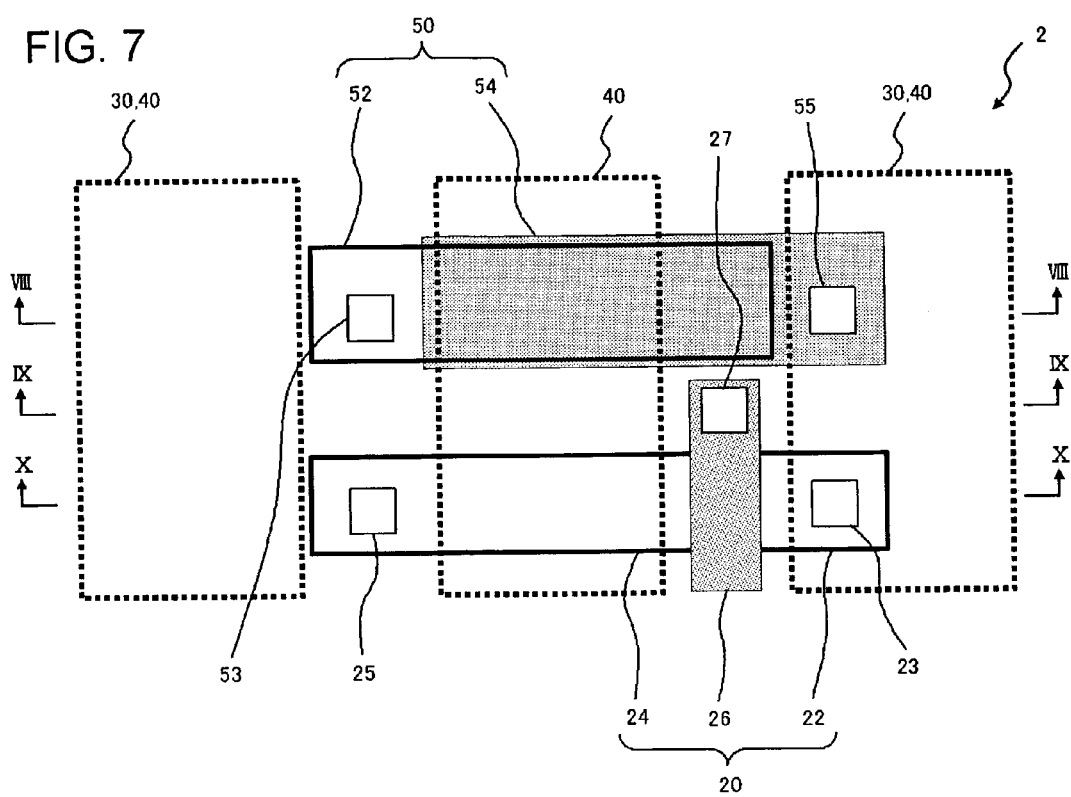
FIG. 7 is a plan view, illustrating second embodiment of a semiconductor device according to the present invention.
Figure 8:
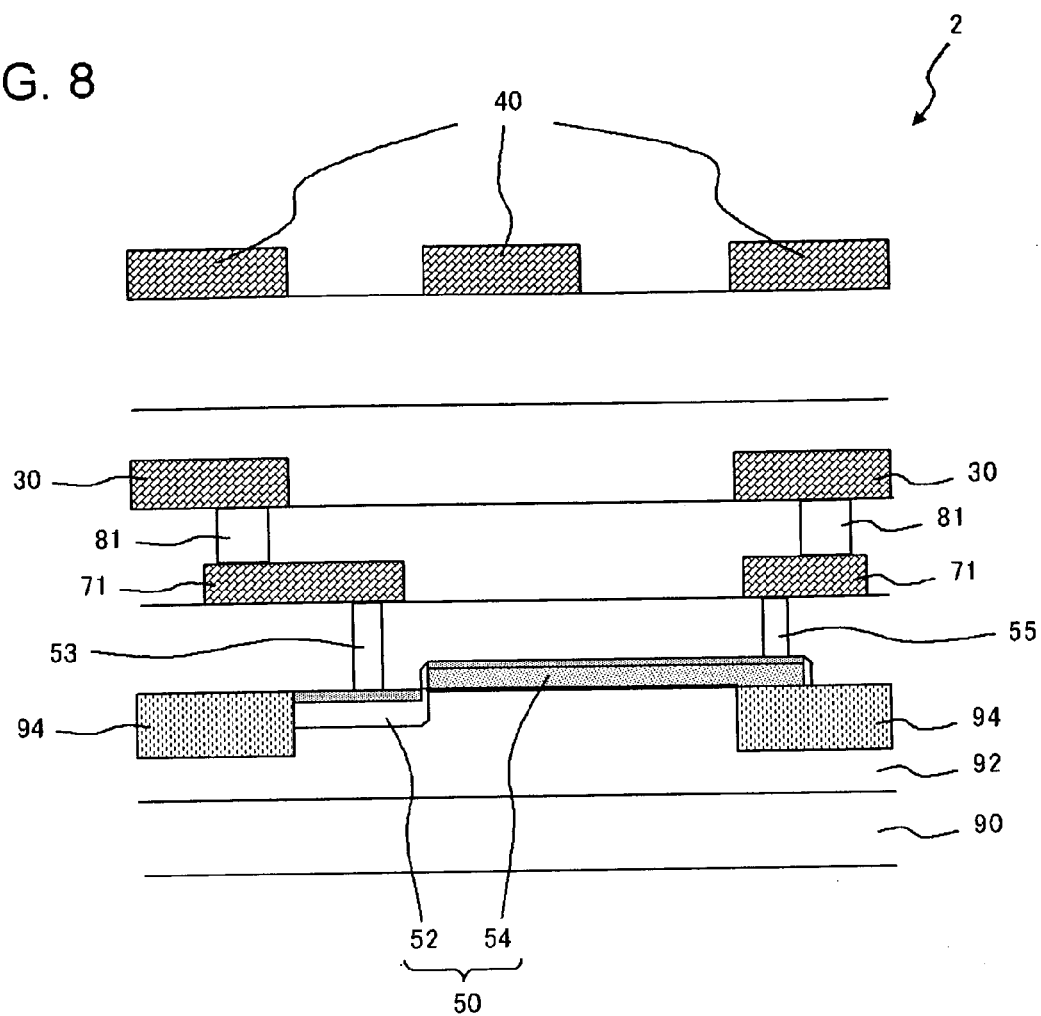
FIG. 8 is a cross-sectional view, showing a cross section of the semiconductor device of FIG. 7 along line VIII-VIII.
Figure 9:
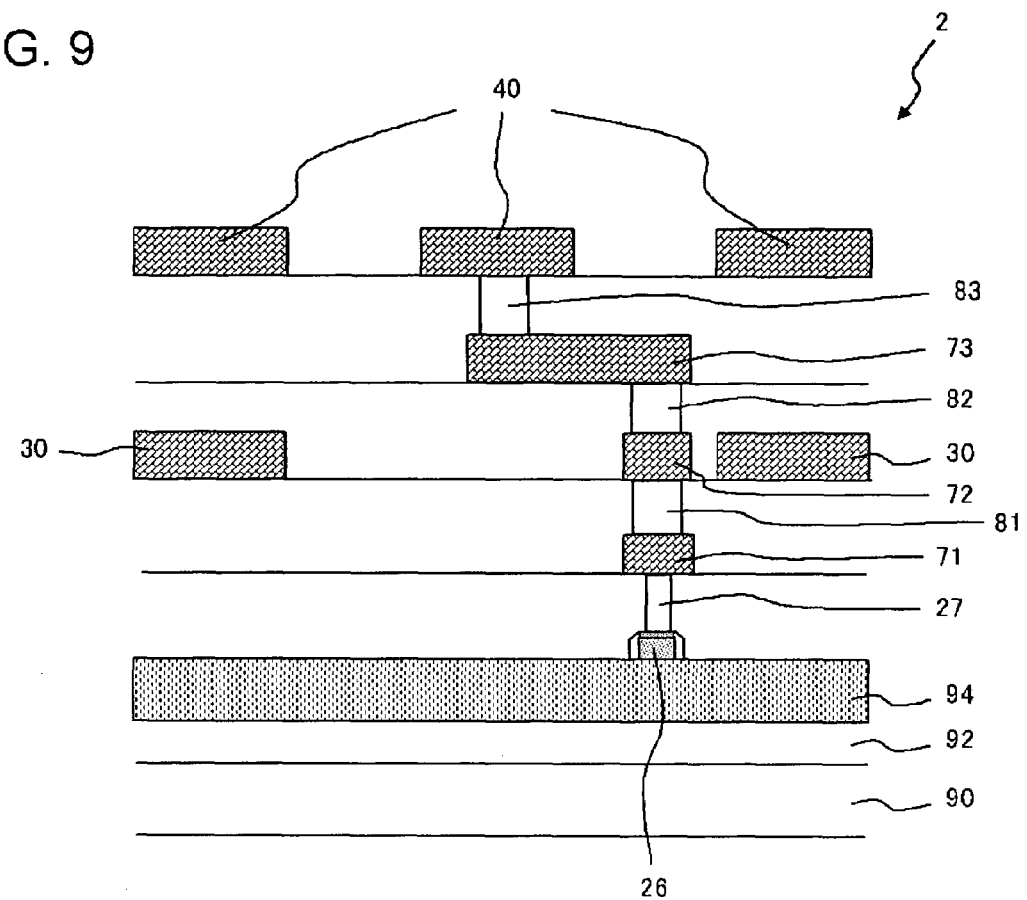
FIG. 9 is a cross-sectional view, showing a cross section of the semiconductor device of FIG. 7 along line IX-IX.
Figure 10:
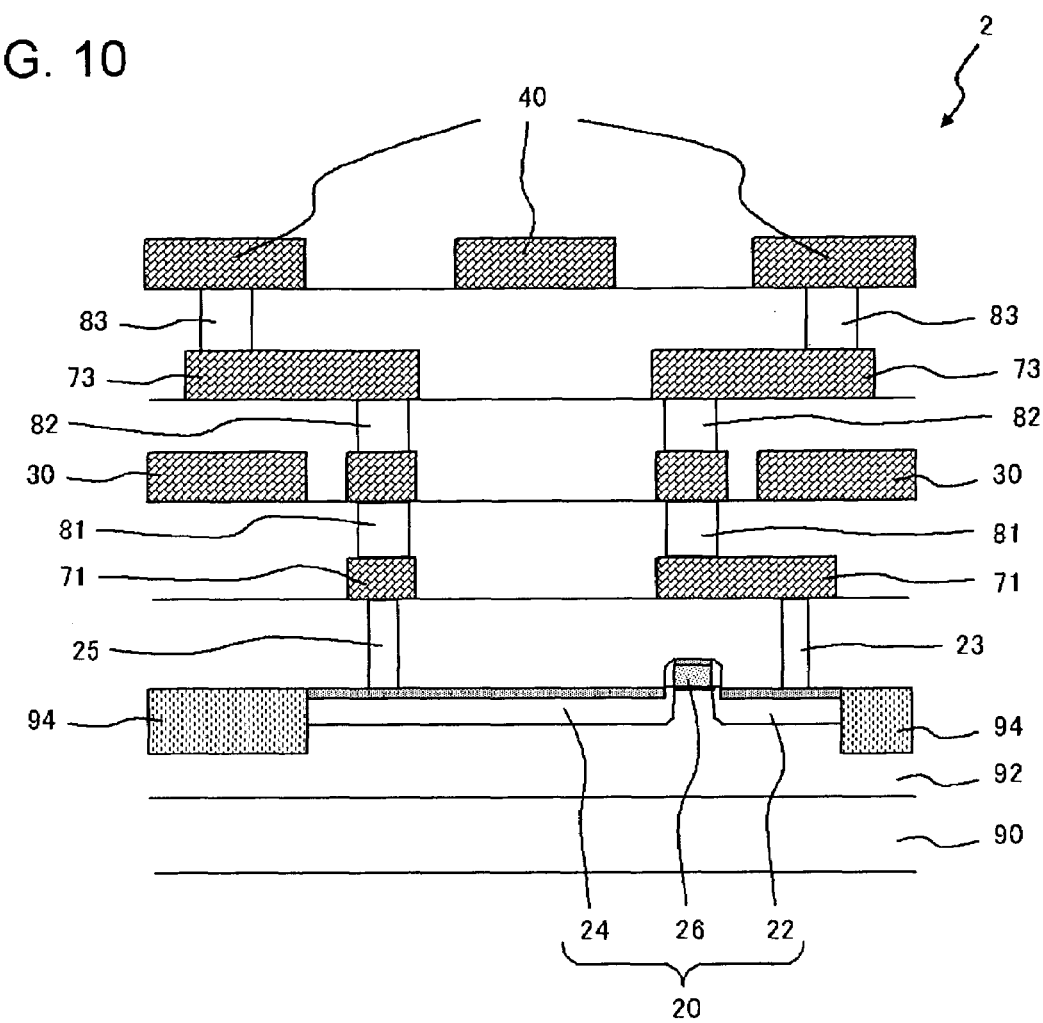
FIG. 10 is a cross-sectional view, showing a cross 20 section of the semiconductor device of FIG. 7 along line X-X.

FIG. 7 is a plan view, illustrating second embodiment of a semiconductor device according to the present invention. FIG. 8, FIG. 9, and FIG. 10 are cross-sectional views, showing cross sections along line VIII-VIII, line IX-IX and line X-X of FIG. 7, respectively. A semiconductor device 2 comprises an evaluation capacitor element 50 (first characteristic evaluation device), an evaluation transistor 20 (second characteristic evaluation device), measurement pads 30 and measurement pads 40. Among these, configurations of the evaluation transistor 20, the measurement pad 30 and the measurement pad 40 are similar as described in relation to the semiconductor device 1. As described above, the semiconductor device 2 has a similar structure as that of the above-described semiconductor device 1, except that the first characteristic evaluation device is a capacitor element.

The evaluation capacitor element 50 includes a diffusion layer 52 and an upper electrode 54. The diffusion layer 52 is formed in a well region 92, and has a structure similar to the structures of the source region 22 and the drain region 24 of the evaluation transistor 20. The upper electrode 54 is formed on the well region 92 via a capacity insulating film which is not shown, and has a structure similar to the structure of the gate electrode 26 of the evaluation transistor 20. In the evaluation capacitor element 50, a channel region that is formed right under the upper electrode 54 in the well region 92 functions as a lower electrode, and the upper electrode 54 functions as an upper electrode. The diffusion layer 52 constitutes a path of an electric charge flowing into the lower electrode (or discharging out from the lower electrode). More specifically, such evaluation capacitor element 50 serves as so-called metal oxide semiconductor (MOS) capacitor.

The measurement pads 30 are coupled to the evaluation capacitor element 50. More specifically, the measurement pads 30 are coupled to the diffusion layer 52 and the upper electrode 54, respectively. That is, a single measurement pad 30 is provided to each of a lower electrode terminal and the upper electrode terminal of the evaluation capacitor element 50. The measurement pad 30 is employed for measuring electrical characteristics of the evaluation capacitor element 50. More specifically, a predetermined potential is applied to the measurement pad 30, so that electrical characteristics of the evaluation capacitor element 50 are measured. These measurement pads 30 are provided in second layer of the interconnect layer.

As shown in FIG. 8, the diffusion layer 52 is coupled to the measurement pad 30 via a contact plug 53, an interconnect 71 and a via plug 81. Similarly, the upper electrode 54 is coupled to the measurement pad 30 via a contact plug 55, the interconnect 71 and the via plug 81.

The semiconductor device 2 having the above-described configuration may be manufactured in a similar process as employed for manufacturing the above-described semiconductor device 1, by forming the evaluation capacitor element 50, in place of forming the evaluation transistor 10. In addition to above, the diffusion layer 52 of the evaluation capacitor element 50 may be preferably formed simultaneously with forming the source region 22 and the drain region 24 of the evaluation transistor 20. Similarly, the upper electrode 54 and the capacity insulating film of the evaluation capacitor element 50 may be preferably formed simultaneously with forming the gate electrode 26 and the gate insulating film of the evaluation transistor 20.

Advantageous effects obtainable by the configuration according to the present embodiment will be described. In the present embodiment, the measurement pads 30 and the measurement pads 40 are coupled to the evaluation capacitor element 50 and the evaluation transistor 20, respectively. Here, the measurement pads 30 are provided in a layer, which is different from a layer provided with the measurement pads 40. This configuration can provides a reduced chip area, as compared with the case where these measurement pads are provided in the same layer. Thus, the semiconductor device 2, which is configured to be suitable for achieving a miniaturization of chips, and the method for manufacturing thereof, are achieved.

Meanwhile, the characteristic evaluations for the evaluation capacitor element 50 in the present embodiment is conducted during the process for manufacturing the semiconductor device 2 (after forming the measurement pad 30). Besides, the characteristics of the capacitor element is, in general, poorly deteriorated during the process for manufacturing the semiconductor device, as compared with the transistor. Therefore, results of the characteristic evaluations for the evaluation capacitor element 50 conducted during the manufacture process manufacture is highly reliable in the manufactured semiconductor device 2. In addition to above, other advantageous effects of the present embodiment are similar to that obtained in first embodiment described above.

Third Emodiment

Figure 11:
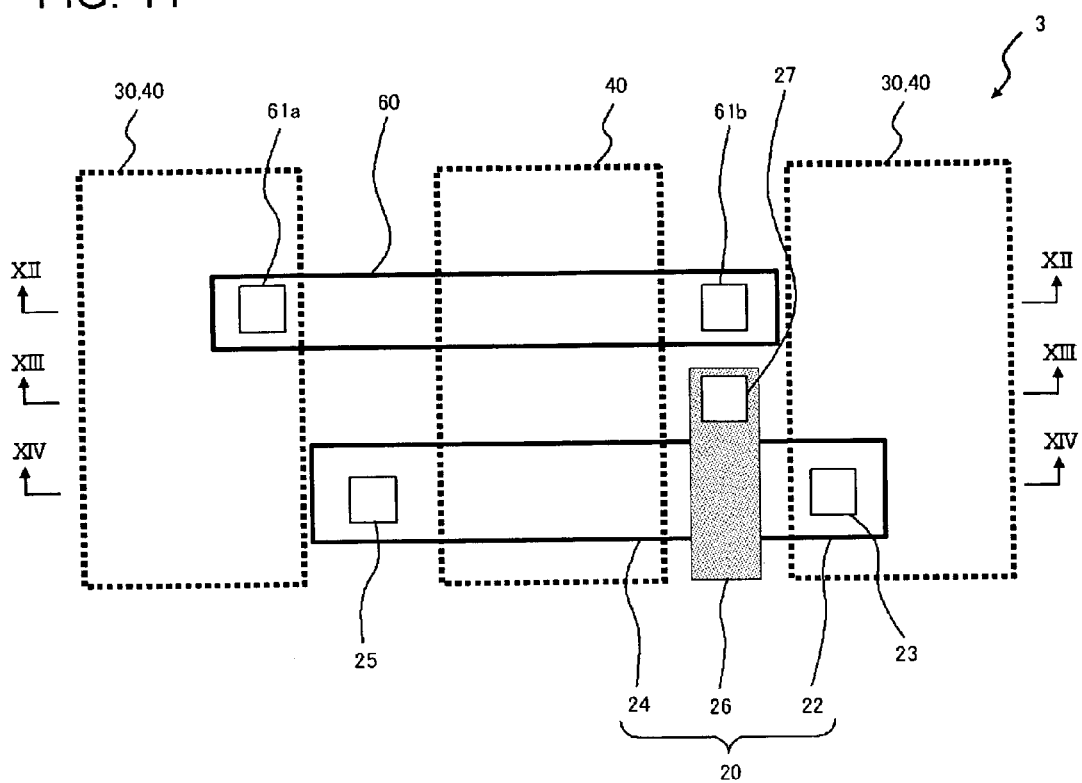
FIG. 11 is a plan view, illustrating third embodiment of a semiconductor device according to the present invention.
Figure 12:
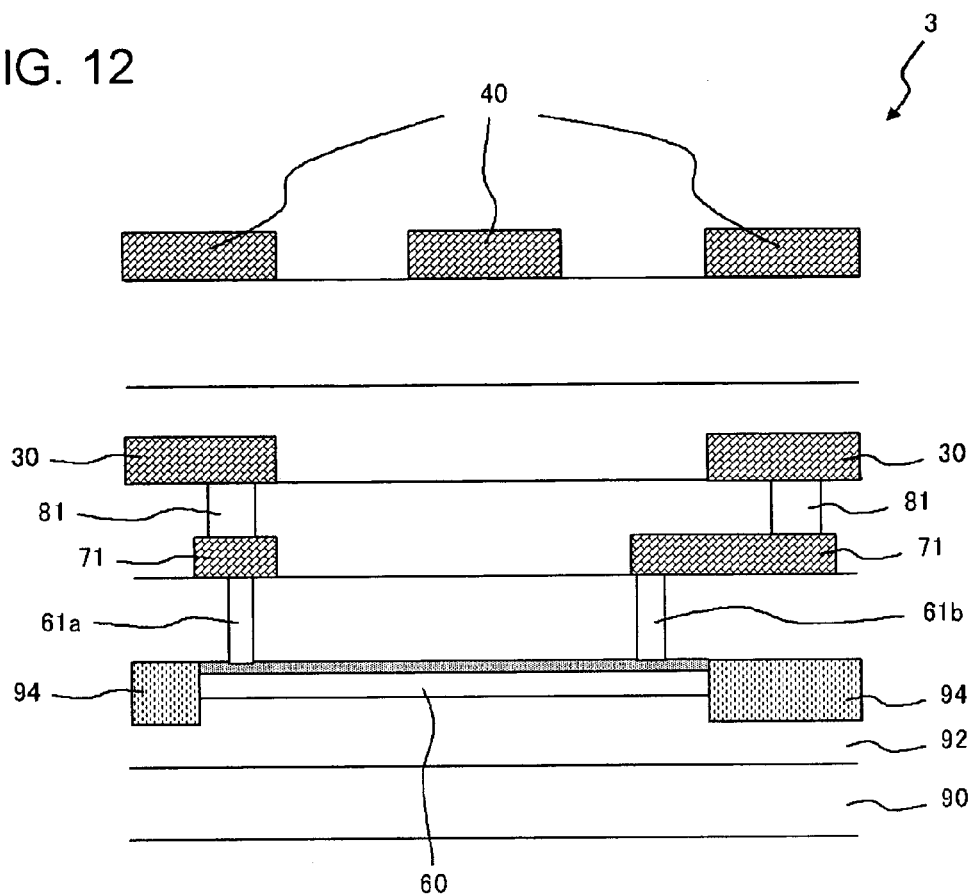
FIG. 12 is a cross-sectional view, showing a cross section of the semiconductor device of FIG. 11 along line XII-XII.
Figure 13:
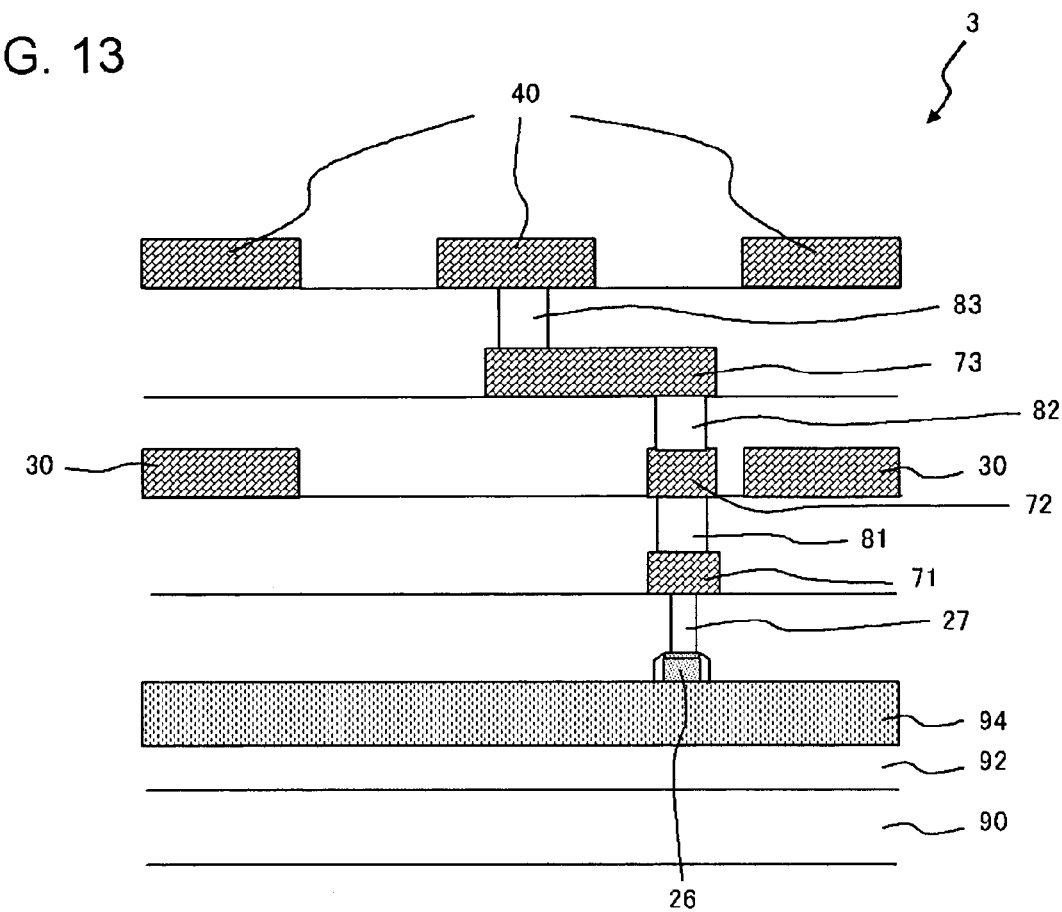
FIG. 13 is a cross-sectional view, showing a cross section of the semiconductor device of FIG. 11 along line XIII-XIII.
Figure 14:
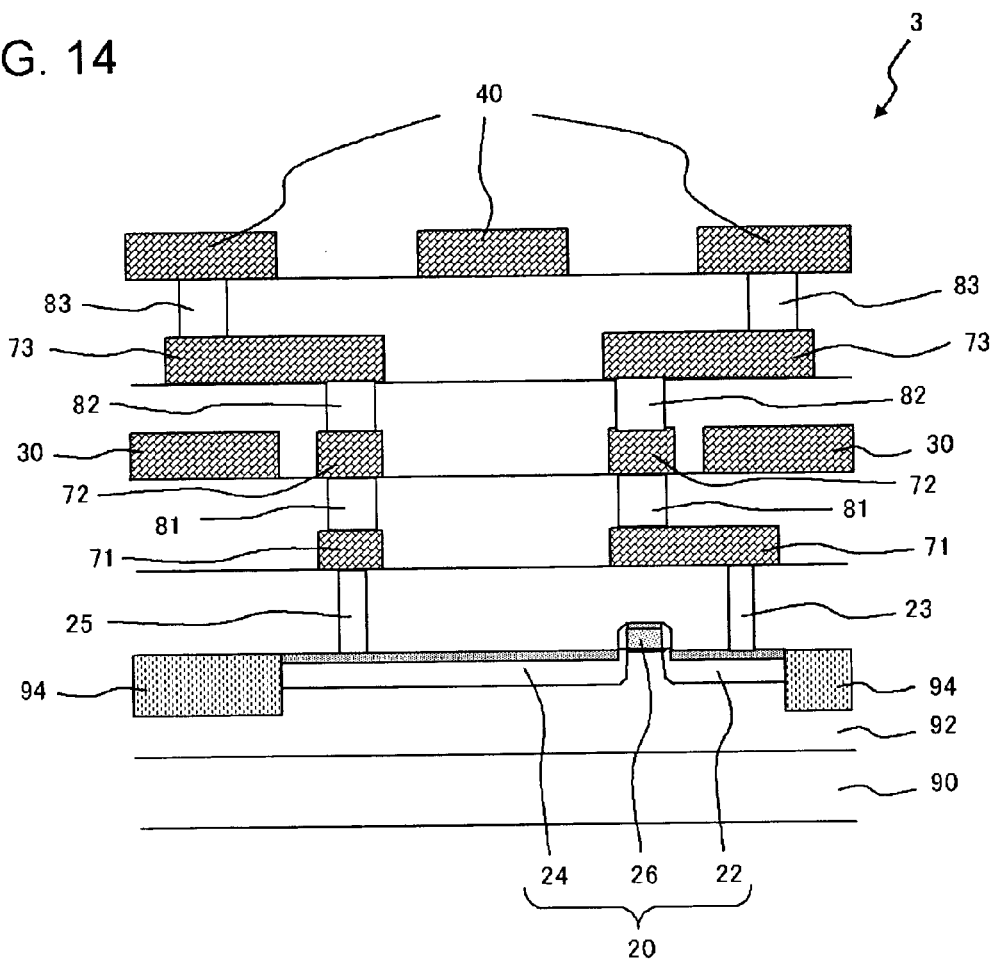
FIG. 14 is a cross-sectional view, showing a cross section of the semiconductor device of FIG. 11 along line XIV-XIV.

FIG. 11 is a plan view, illustrating third embodiment of a semiconductor device according to the present invention. FIG. 12, FIG. 13 and FIG. 14 are cross-sectional views, showing cross sections along line XII-XII, line XIII-XIII and line XIV-XIV of FIG. 11, respectively. A semiconductor device 3 comprises an evaluation resistive element 60 (first characteristic evaluation device), an evaluation transistor 20 (second characteristic evaluation device), measurement pads 30 and measurement pads 40. Among these, configurations of the evaluation transistor 20, the measurement pad 30 and the measurement pad 40 are similar as described in relation to the semiconductor device 1. As described above, the semiconductor device 3 has a similar structure as that of the above-described semiconductor devices 1 and 2, except that the first characteristic evaluation device is a resistive element.

The evaluation resistive element 60 is composed of a diffusion layer formed in a well region 92. This diffusion layer has a structure similar to the structures of the source region 22 and the drain region 24 of the evaluation transistor 20. The measurement pads 30 are coupled to the evaluation resistive element 60. More specifically, the measurement pads 30 are coupled to both ends of the evaluation resistive element 60, respectively. That is, a single measurement pad 30 is provided to each of first terminal and second terminal of the evaluation resistive element 60. The measurement pad 30 is employed for measuring electrical characteristics of the evaluation resistive element 60. More specifically, a predetermined potential is applied to the measurement pad 30, so that electrical characteristics of the evaluation resistive element 60 are measured. These measurement pads 30 are provided in second layer of the interconnect layer.

As shown in FIG. 12, one end of the evaluation resistive element 60 is coupled to the measurement pad 30 via a contact plug 61a, an interconnect 71 and a via plug 81. Similarly, the other end of the evaluation resistive element 60 is coupled to the measurement pad 30 via a contact plug 61b, the interconnect 71 and the via plug 81.

The semiconductor device 3 having the above-described configuration may be manufactured in a similar process as employed for manufacturing the above-described semiconductor device 1, by forming the evaluation resistive element 60, in place of forming the evaluation transistor 10. In addition to above, the diffusion layer of the evaluation resistive element 60 may be preferably formed simultaneously with forming the source region 22 and the drain region 24 of the evaluation transistor 20.

Advantageous effects obtainable by the configuration according to the present embodiment will be described. In the present embodiment, the measurement pads 30 and the measurement pads 40 are coupled to the evaluation resistive element 60 and the evaluation transistor 20, respectively. Here, the measurement pads 30 are provided in a layer, which is different from a layer provided with the measurement pads 40. This configuration can provides a reduced chip area, as compared with the case where these measurement pads are provided in the same layer. Thus, the semiconductor device 3, which is configured to be suitable for achieving a miniaturization of chips, and the method for manufacturing thereof are achieved.

Meanwhile, the characteristic evaluations for the evaluation resistive element 60 in the present embodiment is conducted during the process for manufacturing the semiconductor device 3 (after forming the measurement pad 30). Besides, the characteristics of the resistive element is, in general, poorly deteriorated during the process for manufacturing the semiconductor device, as compared with the transistor and the capacitor element. Therefore, results of the characteristic evaluations for the evaluation resistive element 60 conducted during the manufacture process manufacture is highly reliable in the manufactured semiconductor device 3. In addition to above, other advantageous effects of the present embodiment are similar to that obtained in first embodiment described above.

Fourth Embodiment

Figure 15:
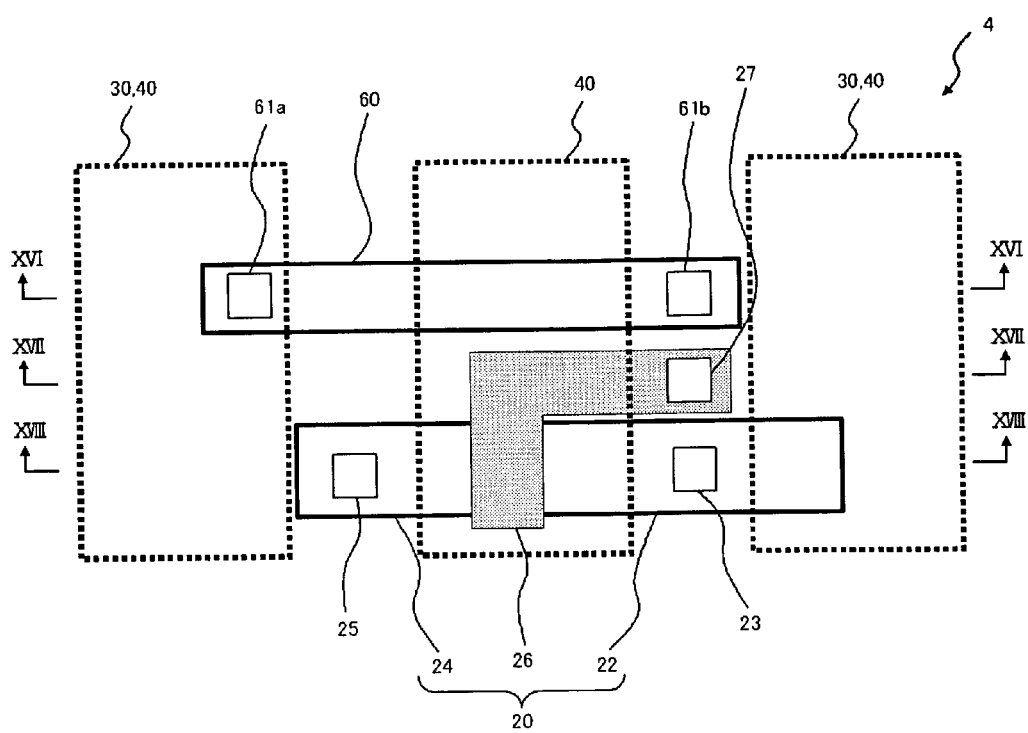
FIG. 15 is a plan view, illustrating fourth embodiment of a semiconductor device according to the present invention.
Figure 16:
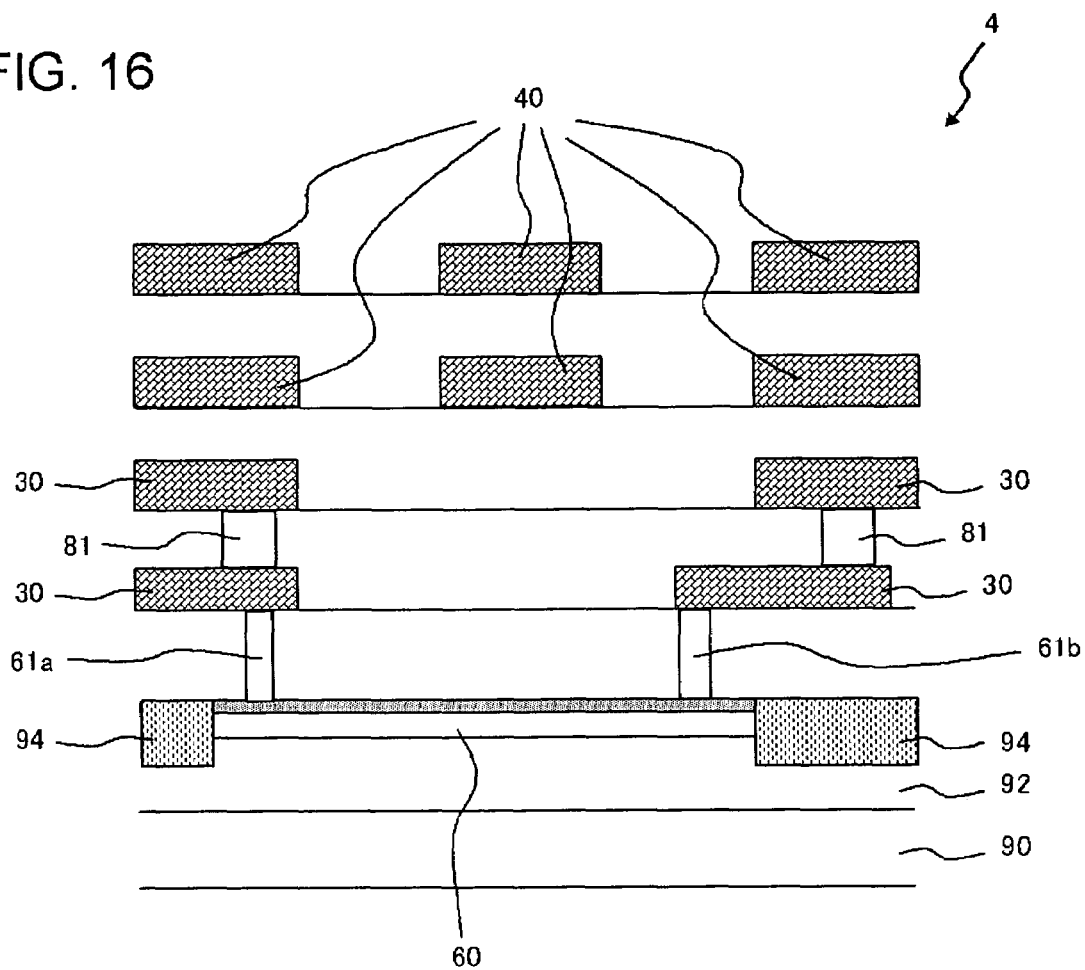
FIG. 16 is a cross-sectional view, showing a cross section of the semiconductor device of FIG. 15 along line XVI-XVI.
Figure 17:
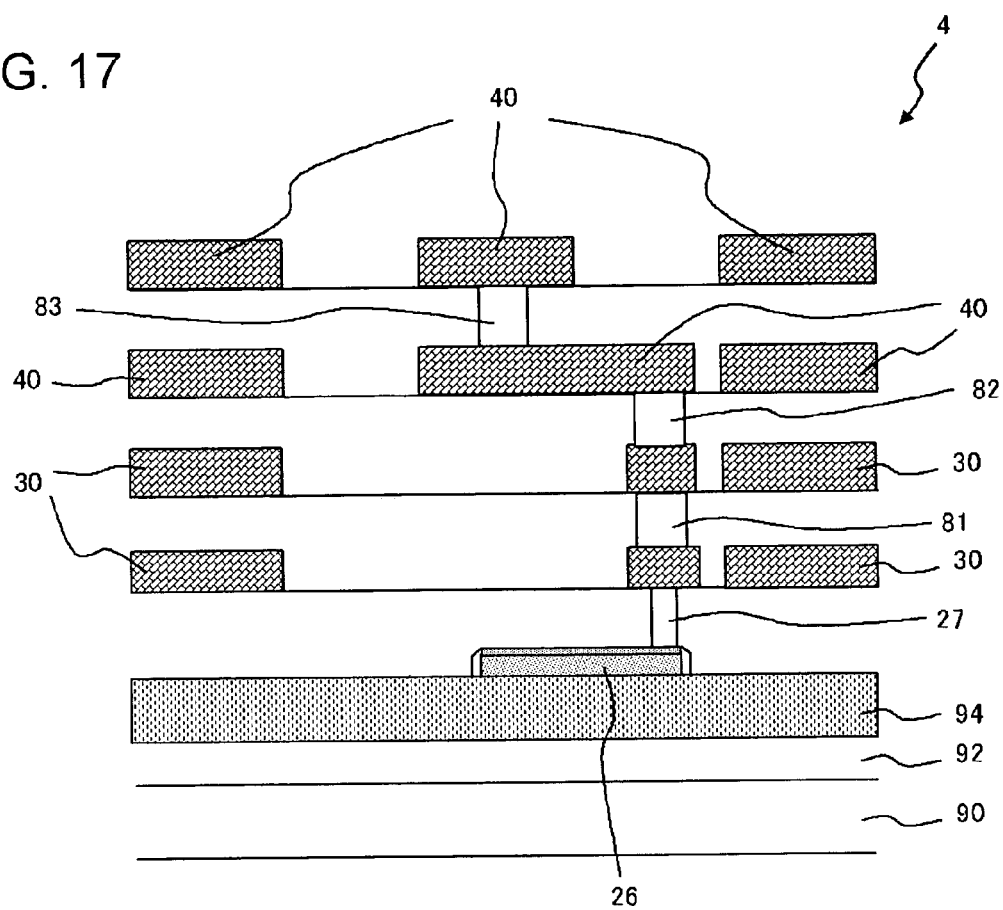
FIG. 17 is a cross-sectional view, showing a cross section of the semiconductor device of FIG. 15 along line XVII-XVII.
Figure 18:
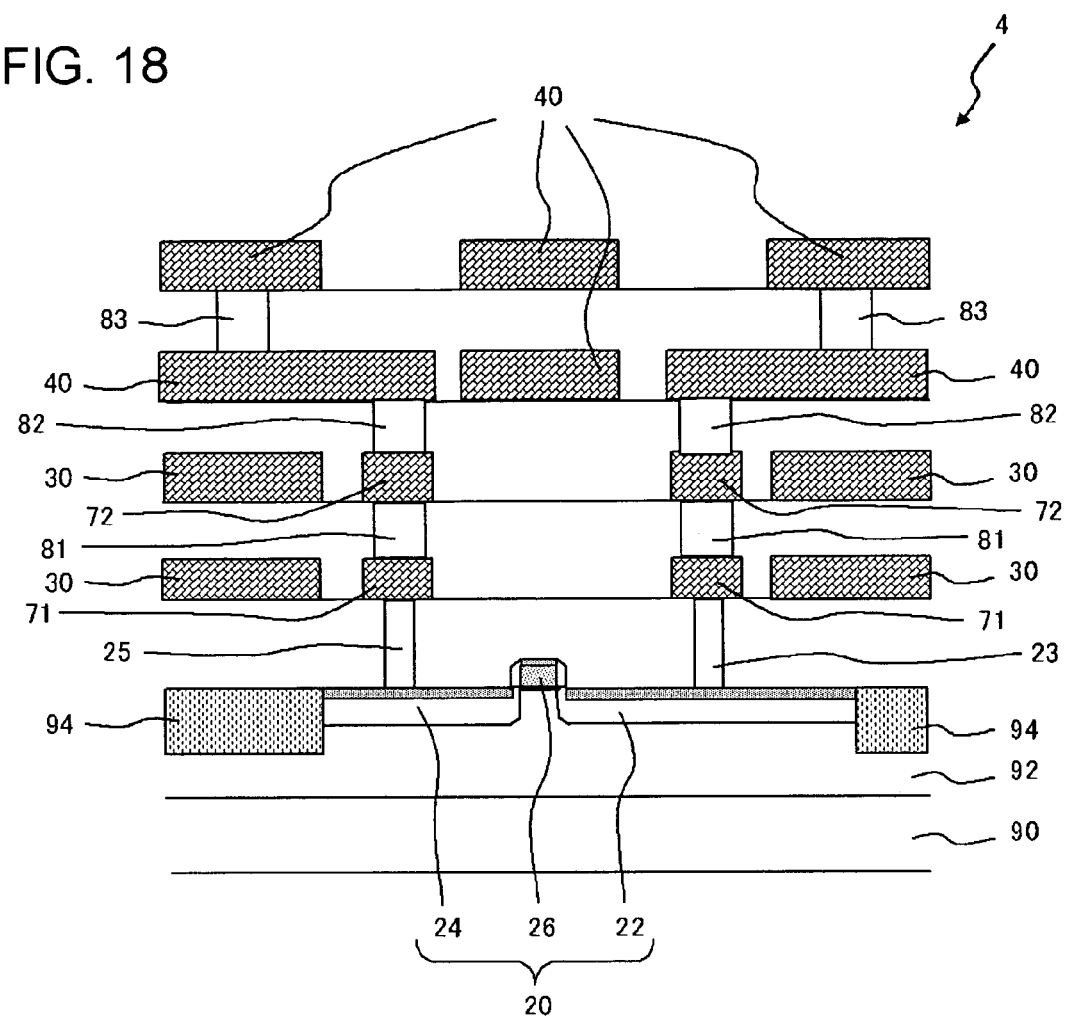
FIG. 18 is a cross-sectional view, showing a cross section of the semiconductor device of FIG. 15 along line XVIII-XVIII.

FIG. 15 is a plan view, illustrating fourth embodiment of a semiconductor device according to the present invention. FIG. 16, FIG. 17, and FIG. 18 are cross-sectional views, showing cross sections along line XVI-XVI, line XVII-XVII and line XVIII-XVIII of FIG. 15, respectively. A semiconductor device 4 comprises an evaluation resistive element 60, an evaluation transistor 20, measurement pads 30 and measurement pads 40. Among these, a configuration of the evaluation transistor 20 is similar as described in relation to the semiconductor device 1. Further, a configuration of the evaluation resistive element 60 similar as described in relation to the semiconductor device 3. As described later, the semiconductor device 4 has a similar structure as that of the above-described semiconductor devices 1, 2 and 3, except that each of the set of the measurement pads 30 and the set of the measurement pads 40 is provided in two or more layers.

In the present embodiment, the measurement pads 30 are provided in first layer and second layer in the interconnect layer. Similarly, the measurement pads 40 are provided in third layer and fourth layer of the interconnect layer. As described above, any of the measurement pads 30 are provided in layers, in which no measurement pad 40 is provided. In other words, no layer provided with both of the measurement pads 30 and the measurement pads 40 exists.

Advantageous effects obtainable by the configuration according to the present embodiment will be described. In the present embodiment, the measurement pads 30 and the measurement pads 40 are coupled to the evaluation resistive element 60 and the evaluation transistor 20, respectively. Here, the measurement pads 30 are provided in layers, which are different from layers provided with the measurement pads 40. This configuration can provides a reduced chip area, as compared with the case where these measurement pads are provided in the same layer. Thus, the semiconductor device 4, which is configured to be suitable for achieving a miniaturization of chips, and the method for manufacturing thereof are achieved.

Further, the measurement pads 30 are provided in two or more layers. Having such configuration, the characteristic evaluations for the evaluation resistive element 60 can be conducted in a plurality of stages in the process for manufacturing the semiconductor device 4. More specifically, in this embodiment, the characteristic evaluations for evaluation resistive element 60 can be conducted in both of a stage after forming the measurement pad 30 in first layer and a stage after forming the measurement pad 30 in second layer. Consequently, an abnormality in the evaluation resistive element 60 can be easily detected in an earlier stage, as compared with the case of providing the measurement pads 30 in only one layer. Similarly, since the measurement pads 40 are provided in two or more layers, an abnormality in the evaluation transistor 20 can be easily detected in an earlier stage.

While the exemplary implementation of providing each of the set of the measurement pads 30 and the set of the measurement pads 40 in two or more layers is illustrated in the present embodiment, only one set in the set of the measurement pads 30 and the set of the measurement pads 40 may be provided in two or more layers and the other set may be provided in one layer. In addition to above, other advantageous effects of the present embodiment are similar to that obtained in first embodiment described above.

Fifth Embodiment

Figure 19:
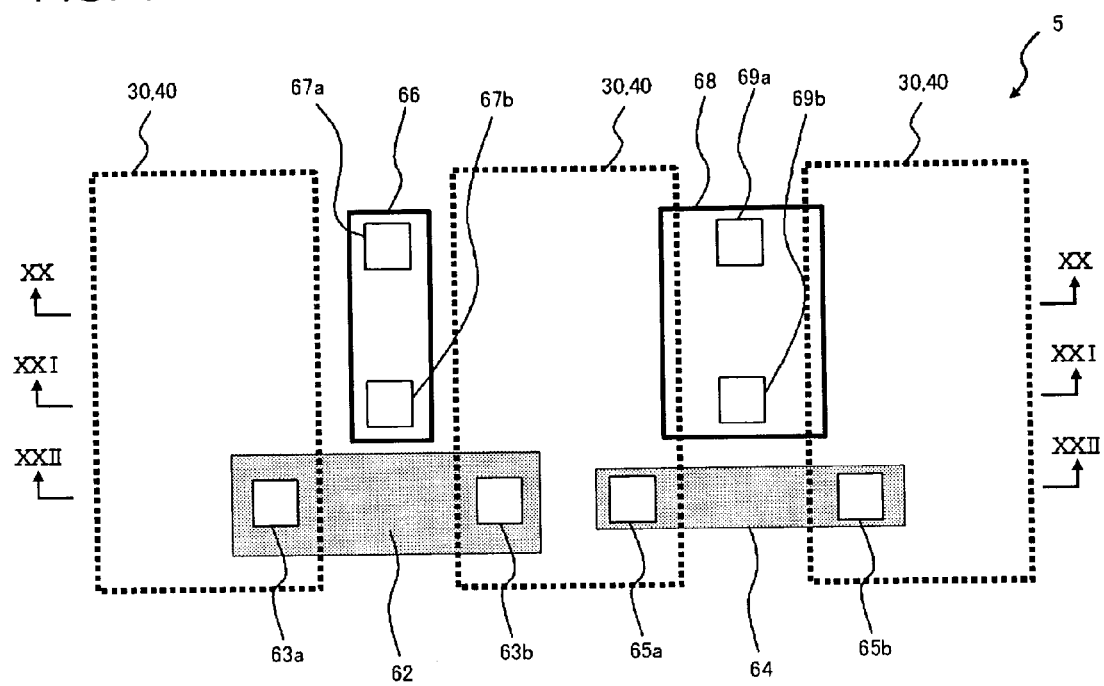
FIG. 19 is a plan view, illustrating fifth embodiment of a semiconductor device according to the present invention.
Figure 20:
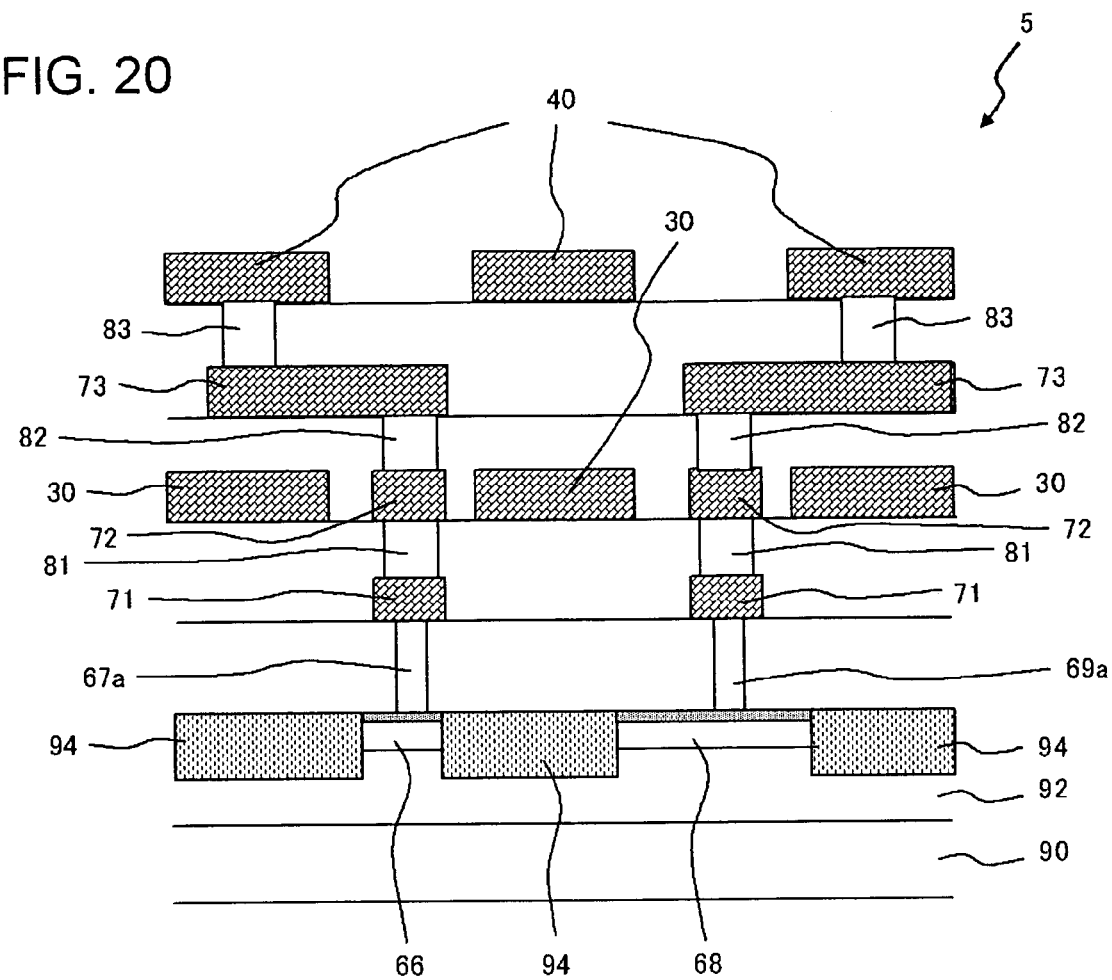
FIG. 20 is a cross-sectional view, showing a cross section of the semiconductor device of FIG. 19 along line XX-XX.
Figure 21:
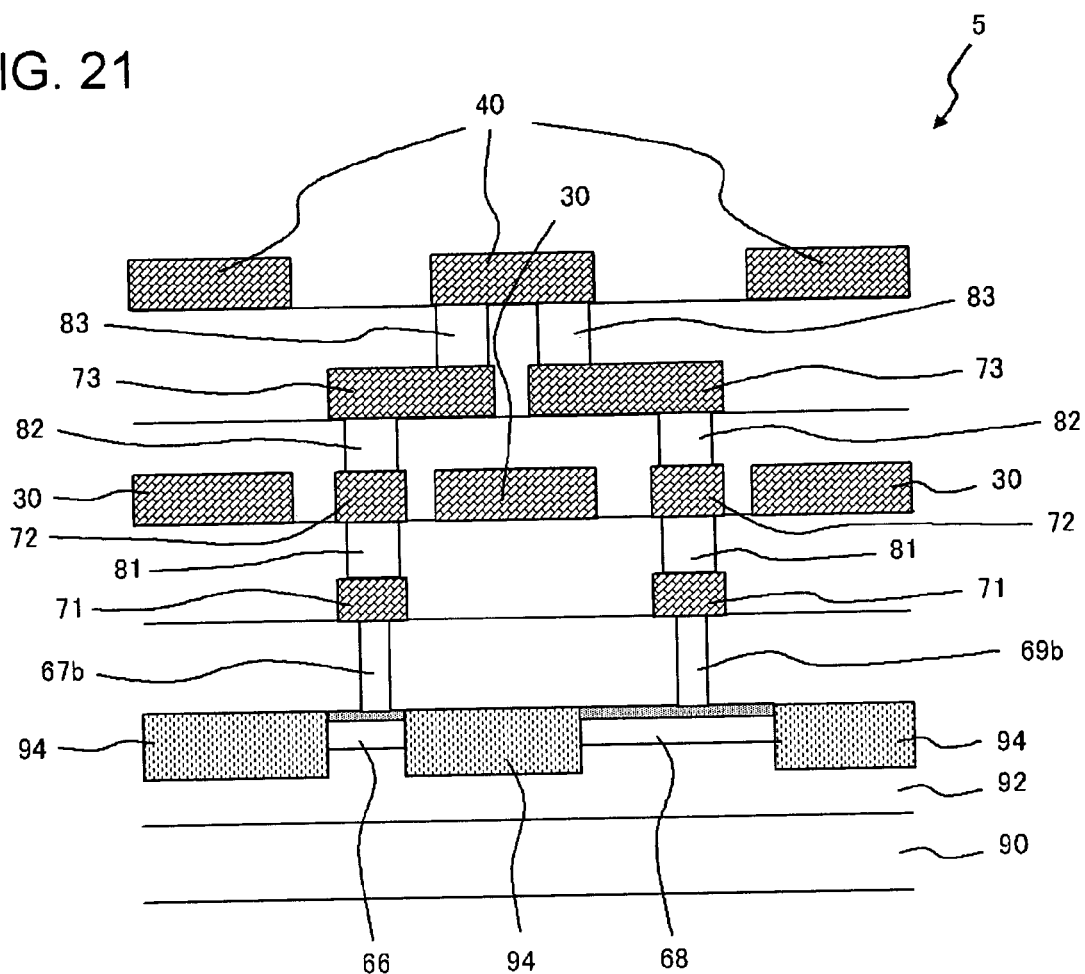
FIG. 21 is a cross-sectional view, showing a cross section of the semiconductor device of FIG. 19 along line XXI-XXI.
Figure 22:
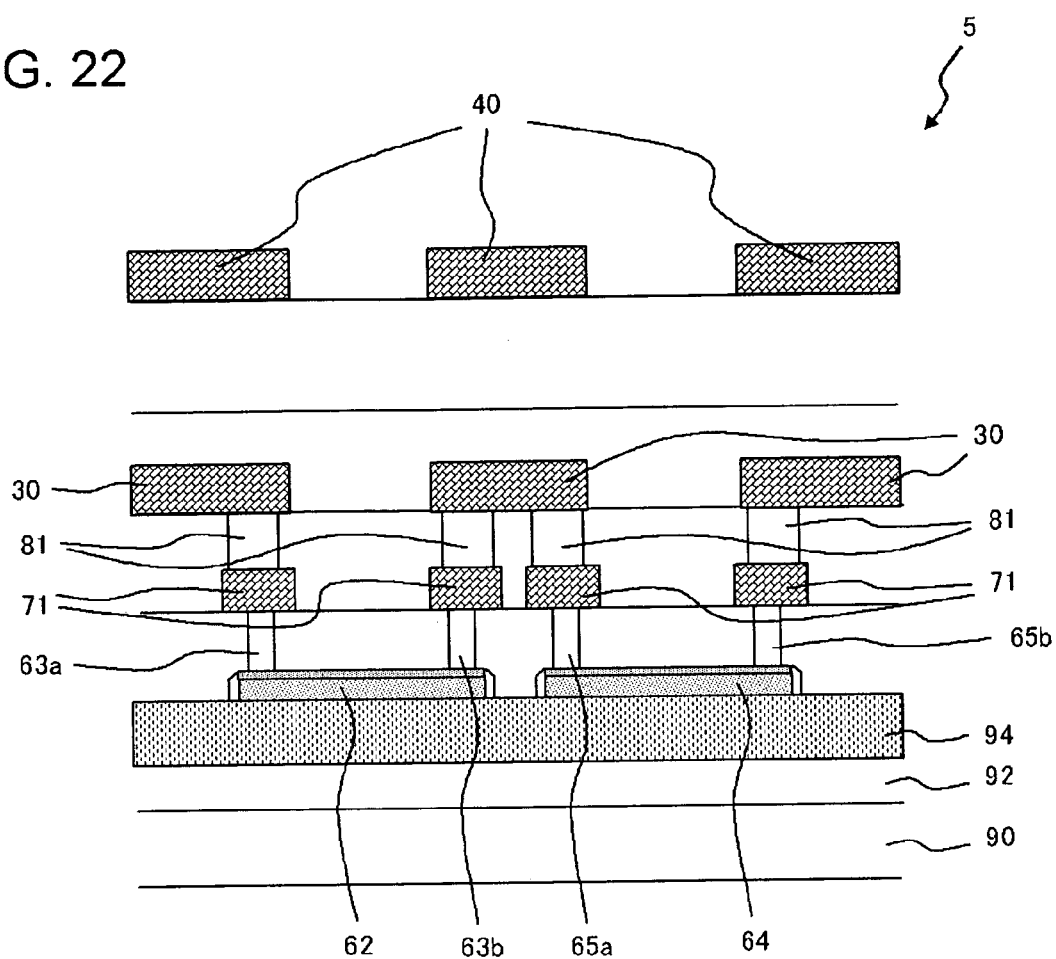
FIG. 22 is a cross-sectional view, showing a cross section of the semiconductor device of FIG. 19 along line XXII-XXII.

FIG. 19 is a plan view, illustrating fifth embodiment of a semiconductor device according to the present invention. FIG. 20, FIG. 21 and FIG. 22 are cross-sectional views, showing cross sections along line XX-XX, line XXI-XXI and line XXII-XXII of FIG. 19, respectively. A semiconductor device 5 comprises an evaluation resistive element 62 (first characteristic evaluation device), an evaluation resistive element 66 (second characteristic evaluation device), an evaluation resistive element 64, an evaluation resistive element 68, measurement pads 30 and measurement pads 40. As described later, the semiconductor device 5 has a similar structure as that of the above-described semiconductor devices 1, 2, 3 and 4, except that the measurement pads 30 and the measurement pads 40 are shared between a plurality of characteristic evaluation devices.

The evaluation resistive elements 66 and 68 are composed of a diffusion layer formed in a well region 92, similarly as the evaluation resistive element 60 of the semiconductor device 3. The measurement pads 40 are coupled to the evaluation resistive element 66. More specifically, the measurement pads 40 are coupled to both ends of the evaluation resistive element 66, respectively. Similarly, the measurement pads 40 are also coupled to both ends of the evaluation resistive element 68, respectively. Here, the evaluation resistive element 66 and the evaluation resistive element 68 share a single measurement pad 40. The measurement pad 40 is employed for measuring electrical characteristics of the evaluation resistive elements 66 and 68. More specifically, a predetermined potential is applied to the measurement pad 40, so that electrical characteristics of the evaluation resistive elements 66 and 68 are measured.

As shown in FIG. 20 and FIG. 21, one end of the evaluation resistive element 66 is coupled to the measurement pad 40 via a contact plug 67a, interconnects 71, 72 and 73 and via plugs 81, 82 and 83. Similarly, the other end of the evaluation resistive element 66 is coupled to the measurement pad 40 via a contact plug 67b, the interconnects 71, 72 and 73 and the via plugs 81, 82 and 83. Further, one end of the evaluation resistive element 68 is coupled to the measurement pad 40 via a contact plug 69a, the interconnects 71, 72 and 73 and the via plugs 81, 82 and 83. Similarly, the other end of the evaluation resistive element 68 is coupled to the measurement pad 40 via a contact plug 69b, the interconnects 71, 72 and 73 and the via plugs 81, 82 and 83. As described above, the other end of the evaluation resistive element 66 and the other end of the evaluation resistive element 68 are coupled to the same measurement pad 40.

The evaluation resistive element 62 and 64 are formed on a well region 92, and have structures similar to that of a gate electrode of a transistor. Material for the evaluation resistive elements 62 and 64 may be, for example polysilicon. The measurement pads 30 are coupled to the evaluation resistive element 62. More specifically, the measurement pads 30 are coupled to both ends of the evaluation resistive element 62, respectively. Similarly, the measurement pads 30 are coupled to both ends of the evaluation resistive element 64, respectively. Here, the evaluation resistive element 62 and the evaluation resistive element 64 share a single measurement pad 30. The measurement pad 30 is employed for measuring electrical characteristics of the evaluation resistive elements 62 and 64. More specifically, a predetermined potential is applied to the measurement pad 30, so that electrical characteristics of the evaluation resistive elements 62 and 64 are measured.

As shown in FIG. 22, one end of the evaluation resistive element 62 is coupled to the measurement pad 30 via a contact plug 63a, the interconnect 71 and the via plug 81. Similarly, the other end of the evaluation resistive element 62 is coupled to the measurement pad 30 via a contact plug 63b, the interconnect 71 and the via plug 81. Further, one end of the evaluation resistive element 64 is coupled to the measurement pad 30 via a contact plug 65a, the interconnect 71 and the via plug 81. Similarly, the other end of the evaluation resistive element 64 is coupled to the measurement pad 30 via a contact plug 65b, the interconnect 71 and the via plug 81. As described above, the other end of the evaluation resistive element 62 and the other end of the evaluation resistive element 64 are coupled to the same measurement pad 30.

Advantageous effects obtainable by the configuration according to the present embodiment will be described.

In the present embodiment, the measurement pads 30 and the measurement pads 40 are coupled to the evaluation resistive element 62 and the evaluation resistive element 64, respectively. Here, the measurement pads 30 are provided in layers, which are different from layers provided with the measurement pads 40. This configuration can provides a reduced chip area, as compared with the case where these measurement pads are provided in the same layer. Thus, the semiconductor device 5, which is configured to be suitable for achieving a miniaturization of chips, and the method for manufacturing thereof are achieved.

Further, the evaluation resistive element 62 and the evaluation resistive element 64, which is a characteristic evaluation device other than the evaluation resistive element 66, share the measurement pad 30. This configuration can provides a reduced chip area, as compared with the case where the measurement pad 30 is not shared by the elements. Similarly, the evaluation resistive element 66 and the evaluation resistive element 68, which is a characteristic evaluation device other than the evaluation resistive element 62, share the measurement pad 40. This configuration can provides a reduced chip area, as compared with the case where the measurement pad 40 is not shared by the elements.

Here, unlikely as the case that the characteristic evaluation device is a transistor, when the characteristic evaluation device is a resistive element or a capacitor element, issues described above in reference to Japanese Patent Laid-Open No. 2000-260,833 (i.e., the issue of insufficient breakdown voltage and the issue of unidentified leakage path) is not caused. Therefore, a reduced chip area can be achieved without disturbing the characteristic evaluations. In addition to above, other advantageous effects of the present embodiment are similar to that obtained in first embodiment described above.

Figure 23A:
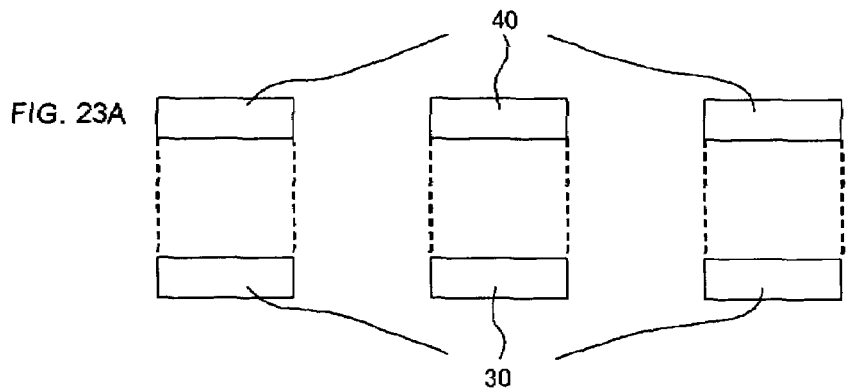
FIGS. 23A to 23C are cross-sectional views, useful for describing a modified embodiment of the present invention.
Figure 23B:
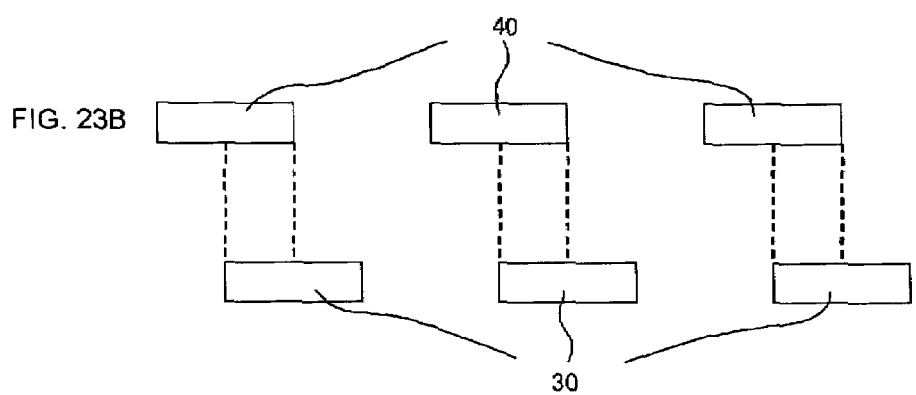
Figure 23C:
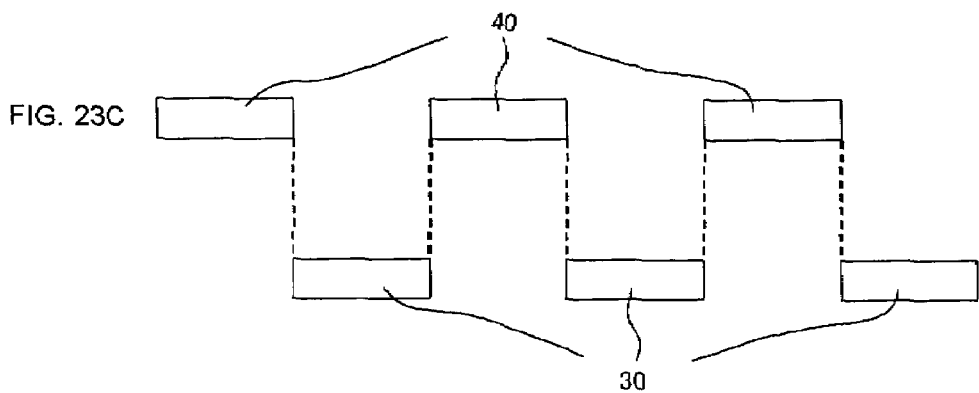

It is not intended that the semiconductor wafer and the semiconductor devices, and the methods for manufacturing thereof according to the present invention is limited to the configurations illustrated in the above-described embodiment, and various modifications thereof are available. For example, the above-described embodiment illustrates the case that the first measurement pad (measurement pad 30) overlaps with the second measurement pad (measurement pad 40) in plan view (FIG. 23A). Alternatively, the first measurement pad may partially overlap with the second measurement pad in plan view, as shown in FIG. 23B. Further, the first measurement pad may not overlap with the second measurement pad in plan view, as shown in FIG. 23C.

If the first measurement pad does not overlap with the second measurement pad at all as described above, a wider space between the first measurement pads and a wider space between the second measurement pads can be ensured, as compared with the case of providing both measurement pads in the same layer. These spaces may be utilized for disposing elements other than the measurement pad (e.g., interconnect, for example). Therefore, even if the first measurement pad does not overlap with the second measurement pad at all, a reduced chip area can be achieved, provided that these measurement pads are provided in different layers.

Figure 25:
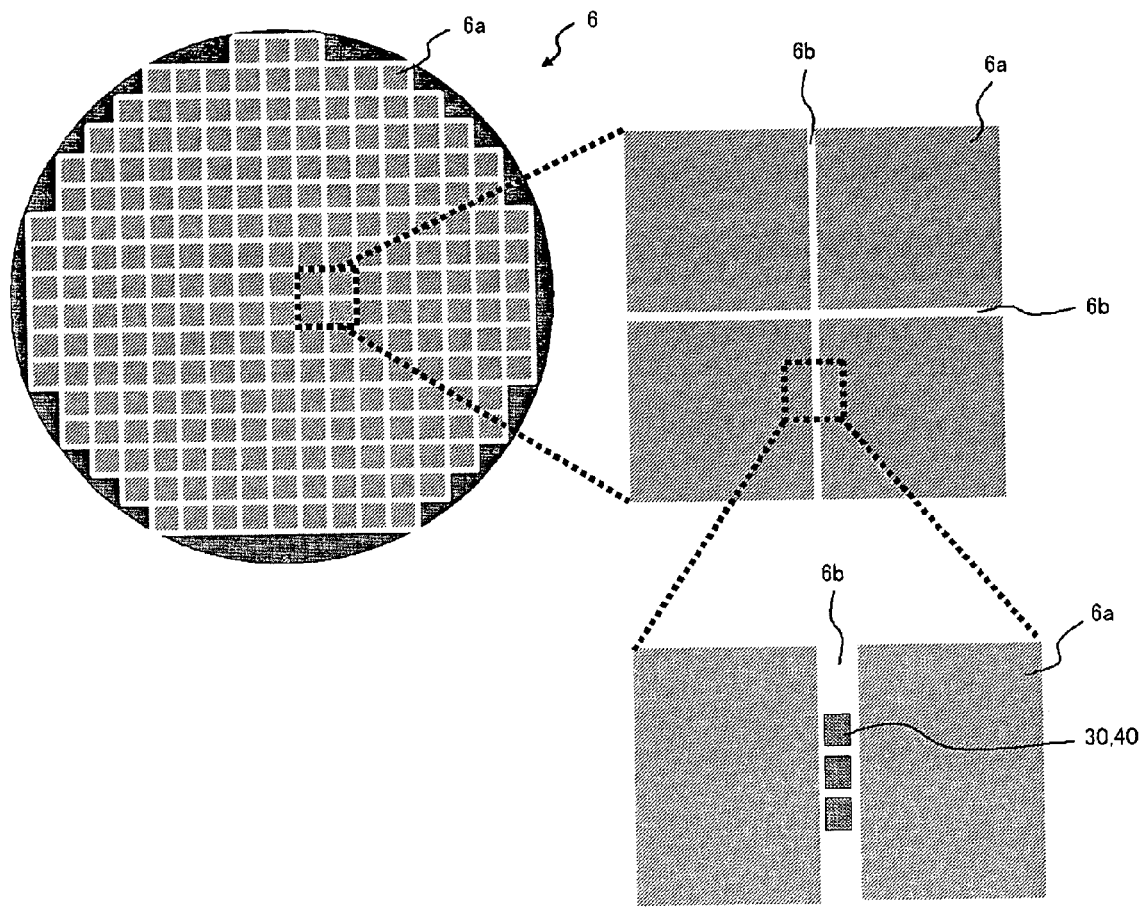
FIG. 25 is a plan view for describing a modified embodiment according to the present invention.

Further, the present invention may be also applied for a semiconductor wafer, in addition to be applied for the semiconductor device in a condition of comprising divided chips formed by a dicing process. An example of such semiconductor wafer is shown in FIG. 25. A semiconductor wafer 6 is provided with a plurality of device regions 6a, which are to be semiconductor chips after a dicing process, and scribe line regions 6b, which are disposed between the device regions 6a. In the semiconductor wafer 6, the first and the second characteristic evaluation devices and the first and the second measurement pads (measurement pads 30 and 40) may be provided in the scribe line regions 6b, as shown in the diagram.

However, in the semiconductor wafer, the first and the second characteristic evaluation devices and the first and the second measurement pads may be provided in only the device region, or may be provided in both of the scribe line region and the device region. If the configuration of providing these devices and pads in the device region is employed, the measurement of the electrical characteristics of the characteristic evaluation device can be conducted after the manufacture of the semiconductor device is completed. This feature is useful in investigating a factor for a malfunction of the semiconductor device. In particular, when these devices and pads are provided in only the device region, a design of having thinner scribe line can be achieved, such that an increased number of chips can be obtained from one piece of wafer.

Further, both of the first and the second characteristic evaluation devices may be capacitor elements. In addition, both of the first and the second characteristic evaluation devices may be resistive elements.

It is apparent that the present invention is not limited to the above embodiment, and may be modified and changed without departing from the scope and spirit of the invention.

What is claimed is:
1. A semiconductor device, comprising:
a first characteristic evaluation device;
a second characteristic evaluation device, which is not the same as said first characteristic evaluation device;
a first measurement pad connected to said first characteristic evaluation device, said first measurement pad for measuring electrical characteristics of the first characteristic evaluation device; and
a second measurement pad connected to said second characteristic evaluation device, said second measurement pad for measuring electrical characteristics of the second characteristic evaluation device,
wherein said first measurement pad and said second measurement pad are provided in different layers.

2. The semiconductor device according to claim 1, wherein said first measurement pad overlaps with said second measurement pad in a plan view.

3. The semiconductor device according to claim 2, wherein said first measurement pad substantially overlaps with said second measurement pad in plan view.

4. The semiconductor device according to claim 1, wherein an area of said first measurement pad is substantially equivalent to an area of said second measurement pad.

5. The semiconductor device according to claim 1, wherein said first characteristic evaluation device involves a different value of a design parameter from a value of a design parameter of said second characteristic evaluation device.

6. The semiconductor device according to claim 5, wherein said design parameter includes a gate length, a gate width, a gate film thickness or an impurity concentration.

7. The semiconductor device according to claim 1, wherein said first measurement pad and said second measurement pad are provided in different layers in an interconnect layer.

8. The semiconductor device according to claim 7, wherein one of said first and said second measurement pads is provided in a top layer in said interconnect layer.

9. The semiconductor device according to claim 1, wherein said first characteristic evaluation device has a plurality of terminals and each of said plurality of terminals is provided with one of said first measurement pads, and
wherein said second characteristic evaluation device has a plurality of terminals and each of said plurality of terminals is provided with one of said second measurement pads.

10. The semiconductor device according to claim 1, wherein said second measurement pad is provided in a layer which is above a layer where said first measurement pad is provided.

11. The semiconductor device according to claim 1, wherein a plurality of first measurement pads are provided in a plurality of layers, and said plurality of first measurement pads are provided in layers where said second measurement pad is not provided.

12. The semiconductor device according to claim 1, wherein said first characteristic evaluation device or said second characteristic evaluation device comprises a capacitor element.

13. The semiconductor device according to claim 1, wherein said first characteristic evaluation device or said second characteristic evaluation device comprises a resistive element.

14. A semiconductor wafer, comprising:
a first characteristic evaluation device;
a second characteristic evaluation device, which is not the same as said first characteristic evaluation device;
a first measurement pad connected to said first characteristic evaluation device, said first measurement pad for measuring electrical characteristics of the first characteristic evaluation device; and
a second measurement pad connected to said second characteristic evaluation device, said second measurement for measuring electrical characteristics of the second characteristic evaluation device, wherein said first measurement pad and said second measurement pad are provided in different layers.

15. The semiconductor wafer according to claim 14, wherein said first characteristic evaluation device and said second characteristic evaluation device and said first measurement pad and said second measurement pad are provided in a scribe line region.

16. A method for manufacturing a semiconductor device, including:

forming a first characteristic evaluation device;

forming a second characteristic evaluation device, which is not the same as said first characteristic evaluation device;

forming a first measurement pad connected to said first characteristic evaluation device;

measuring an electrical characteristic of said first characteristic evaluation device by applying a predetermined potential to said first measurement pad;

forming a second measurement pad connected to said second characteristic evaluation device; and measuring an electrical characteristic of said second characteristic evaluation device by applying a predetermined potential to said second measurement pad, wherein said first measurement pad and said second measurement pad are provided in different layers.

17. The method for manufacturing the semiconductor device according to claim 16, further comprising dicing a wafer after said forming said first and said second measurement pads, said wafer having said first characteristic evaluation device and said second characteristic evaluation device formed therein.

18. The semiconductor device according to claim 1, wherein only the first measurement pad is provided to each of terminals of the first characteristic evaluation device, and wherein only the second measurement pad is provided to each of terminals of the second characteristic evaluation device.

19. The semiconductor wafer according to claim 14, wherein the first measurement pad is coupled to said first characteristic evaluation device rather than coupling to said second characteristic evaluation device.

20. The method for manufacturing the semiconductor device according to claim 16, wherein said first characteristic evaluation device is coupled to said first measuring pad through a contact plug, an interconnect, and a via plug.

* * * * *